(12) United States Patent
Liu et al.

(10) Patent No.: US 12,532,617 B2
(45) Date of Patent: Jan. 20, 2026

(54) DISPLAY SUBSTRATE AND DISPLAY DEVICE

(71) Applicants: Chengdu BOE Optoelectronics Technology Co., Ltd., Chengdu (CN); BOE TECHNOLOGY GROUP CO., LTD., Beijing (CN)

(72) Inventors: Cong Liu, Beijing (CN); Yao Huang, Beijing (CN); Binyan Wang, Beijing (CN); Yu Wang, Beijing (CN); Benlian Wang, Beijing (CN)

(73) Assignees: Chengdu BOE Optoelectronics Technology Co., Ltd., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 716 days.

(21) Appl. No.: 17/796,647

(22) PCT Filed: Sep. 30, 2021

(86) PCT No.: PCT/CN2021/122230
§ 371 (c)(1),
(2) Date: Jul. 30, 2022

(87) PCT Pub. No.: WO2023/050339
PCT Pub. Date: Apr. 6, 2023

(65) Prior Publication Data
US 2024/0188357 A1    Jun. 6, 2024

(51) Int. Cl.
*H10K 59/131*    (2023.01)
*H10K 59/121*    (2023.01)
(Continued)

(52) U.S. Cl.
CPC ....... *H10K 59/131* (2023.02); *H10K 59/1213* (2023.02); *H10K 59/126* (2023.02); *H10K 59/353* (2023.02)

(58) Field of Classification Search
CPC .................. H10K 59/131; H10K 59/1213
See application file for complete search history.

(56) References Cited

U.S. PATENT DOCUMENTS 6,452,213 B1 * 9/2002 Kimura .............. H10D 30/6723
257/E29.295
10,032,953 B2    7/2018 Jeon et al.
(Continued)

FOREIGN PATENT DOCUMENTS

CN    103681751 A    3/2014
CN    204204377 U    3/2015
(Continued)

*Primary Examiner* — Britt D Hanley
*Assistant Examiner* — Jason James Greaving
(74) *Attorney, Agent, or Firm* — HOUTTEMAN LAW LLC

(57) ABSTRACT

Embodiments of the present disclosure provide a display substrate and a display device. The display substrate includes a base substrate, a driving circuit layer on the base substrate, a light-emitting structure layer on a side of the driving circuit layer away from the base substrate, and a shield electrode layer on a side of the driving circuit layer proximal to the base substrate. The light-emitting structure layer includes a plurality of light-emitting devices. The driving circuit layer includes a plurality of pixel driving circuits. At least part of transistors in each of the pixel driving circuits are oxide thin film transistors, and at least part of transistors are low-temperature polycrystalline silicon thin film transistors.

13 Claims, 16 Drawing Sheets

(51) Int. Cl.
    *H10K 59/126*    (2023.01)
    *H10K 59/35*     (2023.01)

(56) References Cited

U.S. PATENT DOCUMENTS

| | | | |
|---|---|---|---|
| 10,629,125 | B2 | 4/2020 | Kim et al. |
| 10,636,783 | B2 | 4/2020 | Xin et al. |
| 2011/0003418 | A1* | 1/2011 | Sakata .............. H01L 21/02565 |
| | | | 438/34 |
| 2011/0132650 | A1 | 6/2011 | Becker et al. |
| 2014/0084286 | A1* | 3/2014 | Jeon .................... H10D 86/423 |
| | | | 438/34 |
| 2015/0206931 | A1* | 7/2015 | Choi ................. H10D 30/6755 |
| 2017/0117343 | A1* | 4/2017 | Oh .................... H10K 59/1213 |
| 2019/0197965 | A1 | 6/2019 | Park et al. |
| 2020/0235187 | A1 | 7/2020 | Bae et al. |
| 2021/0193776 | A1 | 6/2021 | Wang |
| 2021/0399072 | A1* | 12/2021 | Song .................... H10D 86/471 |
| 2022/0181354 | A1* | 6/2022 | Lee .................... H10D 86/423 |
| 2022/0310740 | A1 | 9/2022 | Tang |
| 2023/0263019 | A1* | 8/2023 | Wang .................. H10K 59/131 |
| 2024/0049529 | A1* | 2/2024 | Yang .................. H10K 59/131 |

FOREIGN PATENT DOCUMENTS

| | | | |
|---|---|---|---|
| CN | 107664891 | A | 2/2018 |
| CN | 109216417 | A | 1/2019 |
| CN | 109979387 | A | 7/2019 |
| CN | 111463239 | A | 7/2020 |
| CN | 111883574 | A | 11/2020 |
| CN | 112951891 | A | 6/2021 |
| CN | 113013190 | A | 6/2021 |
| CN | 113314580 | A | 8/2021 |
| KR | 20150080257 | A | 7/2015 |

\* cited by examiner

DISPLAY SUBSTRATE AND DISPLAY DEVICE

TECHNICAL FIELD

The embodiment of the present disclosure belongs to the technical field of display, and in particular, to a display substrate and a display device.

BACKGROUND

Active matrix organic light-emitting diode (AMOLED) display panels are more and more widely used. Pixel display devices of the AMOLED are organic light-emitting diodes (OLEDS). A thin film transistor is driven to generate a driving current in a saturated state, and the driving current drives a light-emitting device to emit light, so that the AMOLED may emit light.

SUMMARY

The present invention aims to solve at least one of the technical problems existing in the prior art, and provides a display substrate having a shielding electrode layer and a display device.

As a first aspect, the technical solution for solving the technical problems of the embodiments of the present disclosure provides a display substrate, which includes: a base substrate, a driving circuit layer on the base substrate, a light-emitting structure layer on a side of the driving circuit layer away from the base substrate, and a shield electrode layer on a side of the driving circuit layer proximal to the base substrate. The light-emitting structure layer includes a plurality of light-emitting devices, the driving circuit layer includes a plurality of pixel driving circuits, at least part of transistors of each of the plurality of pixel driving circuits are oxide thin film transistors, and at least part of transistors of each of the plurality of pixel driving circuits are low-temperature polycrystalline silicon thin film transistors. An orthographic projection of the shield electrode layer on the base substrate at least partially overlaps an orthographic projections of a third transistors in at least part of the plurality of pixel driving circuits on the base substrate. The shield electrode layer is coupled to a constant voltage terminal. The shield electrode layer includes a plurality of shield electrodes, the shield electrodes arranged along a first direction are electrically coupled to each other and the shield electrodes arranged along a second direction are electrically coupled to each other with the first direction intersecting the second direction, such that the plurality of shield electrodes are electrically coupled together to form a mesh structure.

In some embodiments, an orthographic projection of each of the shield electrodes on the base substrate overlaps an orthographic projection of an active layer of the third transistor of a corresponding pixel driving circuit on the base substrate.

In some embodiments, the active layer of the third transistor includes a channel region, and first and second regions on both sides of the channel region, and an orthographic projection of each of the shield electrodes on the base substrate overlaps an orthographic projection of the channel region of the third transistors of the a corresponding pixel driving circuit on the base substrate and does not overlap orthographic projections of the first and second regions of the third transistors of the corresponding pixel driving circuit on the base substrate.

In some embodiments, the shield electrode layer is coupled to the constant voltage terminal via a first power line; the driving circuit layer includes a plurality of circuit units, and at least one of the plurality of circuit units includes a pixel driving circuit, a first shield layer connection electrode, and a second connection electrode; and the shield electrode layer is coupled to the first shield layer connection electrode via a through-hole, the first shield electrode layer connection electrode is coupled to the second connection electrode via a through-hole, and the second connection electrode is coupled to the first power line via a through-hole.

In some embodiments, the shield electrode layer includes a plurality of shield electrodes; each of the plurality of shield electrodes is coupled to a corresponding first shield layer connection electrode via a through-hole, the corresponding first shield layer connection electrodes is coupled to a corresponding second connection electrode via a through-hole, and the corresponding at least one second connection electrode is coupled to the first power line via a through-hole.

In some embodiments, for each of the plurality of circuit units, an orthographic projection of the through-hole coupling the shield electrode to the corresponding first shield layer connection electrode on the base substrate does not overlap an orthographic projection of the through-hole coupling the corresponding first shield layer connection electrode to the corresponding second connection electrode on the base substrate.

In some embodiments, the shield electrode layer is coupled to the constant voltage terminal via a second power line; the display substrate includes a display region and a frame region surrounding the display region, and the frame region includes at least one second power line; and a portion of the shield electrode layer in the frame region is electrically coupled to the at least one second power line via a through-hole.

In some embodiments, the shield electrode layer includes a plurality of second shield layer connection electrodes in the frame region and the plurality of shield electrodes electrically coupled to each other in the display region, with the plurality of shield electrodes being electrically coupled to the plurality of second shield layer connection electrodes respectively, and the plurality of second shield layer connection electrodes are electrically coupled to the at least one second power line via through-holes.

In some embodiments, the shield electrodes arranged in the first direction are electrically coupled to each other, and the shield electrodes arranged along the second direction are electrically coupled to each other; the second shield layer connection electrodes arranged along the first direction are electrically coupled to each other; and the shield electrode in the row closest to the frame region is electrically coupled to a corresponding second shield layer connection electrode via a first connection line; the first direction intersects the second direction.

In some embodiments, the shield electrode layer is coupled to the constant voltage terminal via a first reference voltage line, the display substrate includes a display region and a frame region surrounding the display region, and the at least one first reference voltage line is in the frame region, and a portion of the shield electrode layer in the frame region is electrically coupled to the at least one first reference voltage line via a through-hole.

In some embodiments, a first notch portion is between two adjacent shield electrodes in the first direction, and/or a second notch portion is between two adjacent shield electrodes in the second direction.

In some embodiments, an orthographic projection of the first notch portion on the base substrate does not overlap an orthographic projection of an active layer of a fourth transistor of a corresponding pixel driving circuit on the base substrate, and/or an orthographic projection of the second notch portion on the base substrate does not overlap an orthographic projection of an active layer of a fifth transistor of the corresponding pixel driving circuit on the base substrate.

In some embodiments, an orthographic projection of each of the plurality of shield electrodes on the base substrate overlaps an orthographic projection of a first electrode of a storage capacitor of a corresponding pixel driving circuit on the base substrate.

In some embodiments, an edge of the orthographic projection of the shield electrode on the base substrate is conformal to an edge of the orthographic projection of the first electrode on the base substrate.

In some embodiments, the driving circuit layer includes a shield electrode layer, a first semiconductor layer, a first conductive layer, a second semiconductor layer, a third conductive layer, a fourth conductive layer, and a fifth conductive layer sequentially stacked in a direction away from the base substrate; the shield electrode layer includes a plurality of shield electrodes; an orthographic projection of each of the shield electrodes on the base substrate overlaps an orthographic projection of an active layer of a third transistor of a corresponding pixel driving circuit on the base substrate; the first semiconductor layer includes a gate electrode of a third transistor, a gate electrode of a fourth transistor, a gate electrode of a fifth transistor, a gate electrode of a sixth transistor, and a gate electrode of a seventh transistor in the pixel driving circuit; the first conductive layer includes a first scanning line, a light-emitting control line and a first electrode of a storage capacitor in the pixel driving circuit; the second conductive layer includes a first gate electrode of a first transistor of the pixel driving circuit, a first gate electrode of a second transistor, a second electrode of the storage capacitor of the pixel driving circuit, a first portion of a second scanning line and a first portion of a reset signal line; the second semiconductor layer includes an active layer of a first transistor and an active layer of a second transistor of the pixel driving circuit; the third conductive layer includes a second gate electrode of the first transistor and a second gate electrode of the second transistor of the pixel driving circuit, a second portion of the second scanning line and a second portion of the reset signal line; the fourth conductive layer has a plurality of connection electrodes including a plurality of second connection electrodes; and the fifth conductive layer includes a first initial signal line, a second initial signal line, a first power line, and a data line.

In some embodiments, the shield electrode layer is coupled to the constant voltage terminal via the first power line, the first conductive layer further includes a plurality of first shield layer connection electrodes, or the second conductive layer further includes a plurality of first shield layer connection electrodes, an orthographic projection of each of the plurality of first shield layer connection electrodes on the base substrate is between an orthographic projection of the light-emitting control line on the base substrate and an orthographic projection of the first scanning line on the base substrate, and each of the plurality of shield electrodes is coupled to a corresponding first shield layer connection electrode via a through-hole, the corresponding first shield layer connection electrodes is coupled to a corresponding second connection electrode via a through-hole, and the corresponding second connection electrode is coupled to the first power line via a through-hole.

In some embodiments, the shield electrode layer is coupled to the constant voltage terminal via a second power line, the display substrate includes a display region and a frame region surrounding the display region, the fourth conductive layer includes the second power line in the frame region, and a portion of the shield electrode layer in the frame region is electrically coupled to the at least one second power line via a through-hole, and the shield electrode layer includes a plurality of second shield layer connection electrodes in the frame region; and the plurality of shield electrodes are electrically coupled to each other and located in the display region, with the plurality of shield electrodes being electrically coupled to the plurality of second shield layer connection electrodes respectively, and the plurality of second shield layer connection electrodes are electrically coupled to the second power line via through-holes.

In some embodiments, the shield electrode layer is coupled to the constant voltage terminal via a first reference voltage line, the display substrate includes a display region and a frame region surrounding the display region, the fourth conductive layer further includes the at least one first reference voltage line in the frame region, and a portion of the shield electrode layer in the frame region is electrically coupled to the at least one first reference voltage line via a through-hole.

As a second aspect, an embodiment of the present disclosure provides a display device including the display substrate described above.

DETAIL DESCRIPTION OF EMBODIMENTS

In order to enable one of ordinary skill in the art to better understand the technical solutions of the embodiments of the present disclosure, the embodiments of the present disclosure are described in further detail below with reference to the accompanying drawings and the detailed description.

Unless defined otherwise, technical or scientific terms used herein shall have the ordinary meaning as understood by one of ordinary skill in the art to which the present disclosure belongs. The use of "first," "second," and the like in the present disclosure is not intended to indicate any order, quantity, or importance, but rather is used to distinguish one element from another. Also, the use of the terms "a", "an", or "the" and similar referents do not denote a limitation of quantity, but rather denote the presence of at least one. The word "include" or "comprise" and the like means that the element or item preceding the word includes the element or item listed after the word and its equivalent, but does not exclude other elements or items. The terms "connect" or "couple" and the like are not restricted to physical or mechanical connections, but may include electrical connections, whether direct or indirect. "Upper", "lower", "left", "right", and the like are used only to indicate relative positional relationships, and when the absolute position of the object being described is changed, the relative positional relationships may also be changed accordingly.

Figure 1A:
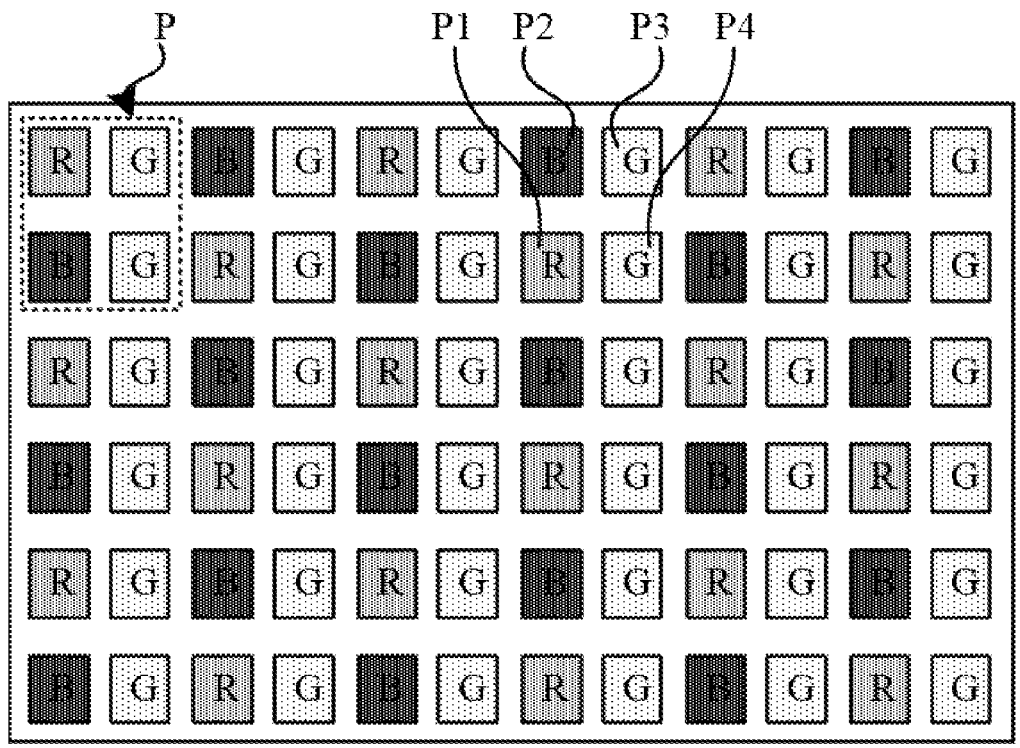
FIG. 1a and FIG. 1b are plan views showing structures of a display substrate.
Figure 1B:
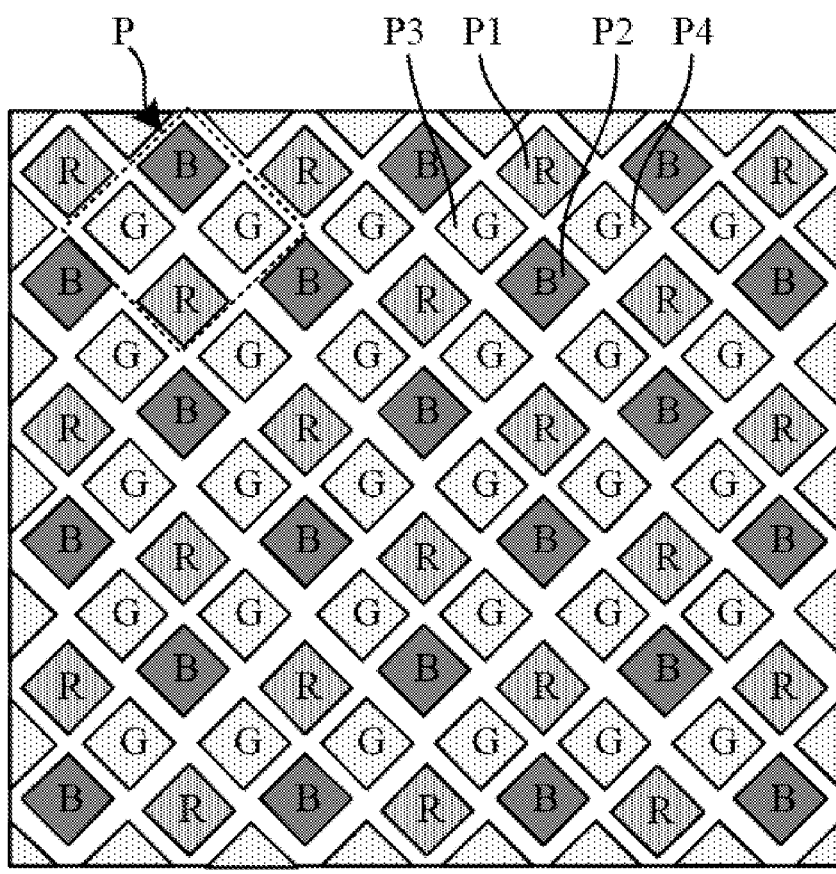

FIG. 1a and FIG. 1b are plan views showing structures of a display substrate. In an exemplary embodiment, the display substrate may include a plurality of pixel units P arranged in a matrix. At least one of the pixel units P may include one first subpixel P1 emitting light in a first color, one second subpixel P2 emitting light in a second color, and one third subpixel P3 and one fourth subpixel P4 emitting light in a third color. Each of the four subpixels may include a circuit unit and a light-emitting device. The circuit unit may include a scan signal line, a data signal line, a light-emitting signal line, and a pixel driving circuit. The pixel driving circuit may be coupled to the scan signal line, the data signal line, and the light-emitting signal line respectively, and the pixel driving circuit may be configured to receive a data voltage transmitted from the data signal line and output a corresponding current to the light-emitting device under the control of the scan signal line and the light-emitting signal line. The light-emitting device in each subpixel is coupled to the pixel driving circuit of the subpixel, and the light-emitting device is configured to emit light with corresponding brightness in response to the current output by the pixel driving circuit of the subpixel.

In some examples, the first subpixel P1 may be a red subpixel (R) emitting red light, the second subpixel P2 may be a blue subpixel (B) emitting blue light, and both of the third subpixel P3 and the fourth subpixel P4 may be a green subpixel (G) emitting green light. In an exemplary embodiment, the light emitting region of the subpixel may be in a shape of a rectangle, a diamond, a pentagon, or a hexagon. In one exemplary embodiment, the four subpixels may be arranged in a square manner to form a pixel arrangement of GGRB, as shown in FIG. 1a. In another exemplary embodiment, the four subpixels may be arranged in a diamond manner to form a pixel arrangement of RGBG, as shown in FIG. 1b. In other exemplary embodiments, the four subpixels may be aligned horizontally or vertically. In an exemplary embodiment, each of the pixel units may include three subpixels aligned horizontally or vertically or arranged in a manner like a triangle, which is not limited by the present disclosure here.

Figure 1C:
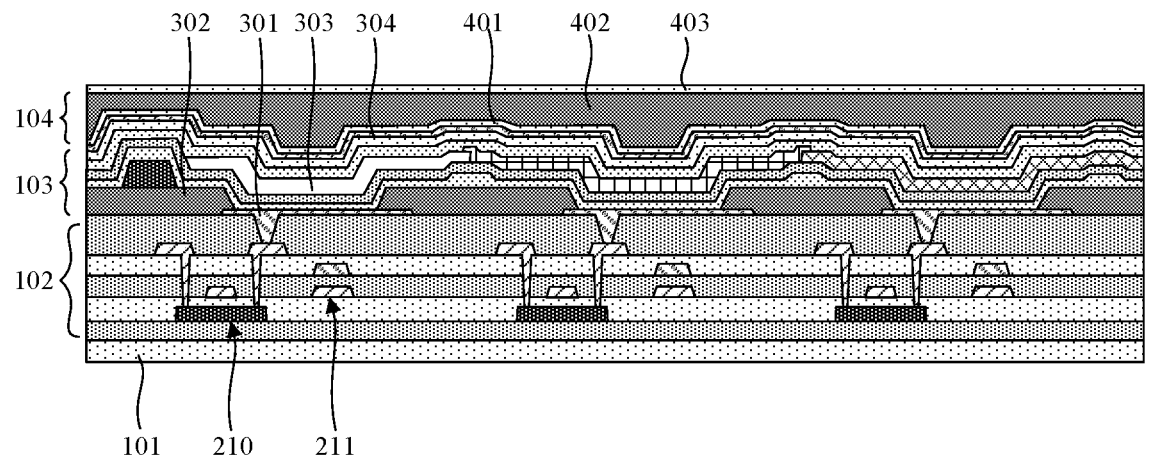
FIG. 1c is a schematic cross-sectional view of an exemplary display substrate.

FIG. 1c is a schematic cross-sectional view of an exemplary display substrate, showing a structure of three subpixels of the display substrate. As shown in FIG. 1c, in a plane perpendicular to the display substrate, the display substrate may include a driving circuit layer 102 disposed on a base substrate 101, a light-emitting structure layer 103 disposed on a side of the driving circuit layer 102 away from the base substrate, and an encapsulation layer 104 disposed on a side of the light-emitting structure layer 103 away from the base substrate. In some implementations, the display substrate may include other film layers, such as spacer pillars and the like, which are not limited in the present disclosure.

In an exemplary embodiment, the base substrate 101 may be a flexible base substrate or a rigid base substrate. The driving circuit layer 102 of each of the subpixels may include a plurality of signal lines and a pixel driving circuit, and the pixel driving circuit may include a plurality of transistors and a storage capacitor. FIG. 1c shows only one driving transistor 210 and only one storage capacitor 211 as an example. In some embodiments of the present disclosure, in addition to the driving transistor 210 in FIG. 1c, the pixel driving circuit may include a transistor having an active layer made of a metal oxide, such as IGZO; in this case, the driving circuit layer 102 may at least include a second semiconductor layer.

The light-emitting structure layer 103 of each of the subpixels may include a plurality of film layers for forming a light-emitting device. The plurality of film layers may include an anode 301, a pixel definition layer 302, an organic light-emitting layer 303, and a cathode 304. The anode 301 is coupled to a drain electrode of the driving transistor 210 via a through-hole, the organic light-emitting layer 303 is coupled to the anode 301, and the cathode 304 is coupled to the organic light-emitting layer 303. The organic light-emitting layer 303 emits light of a corresponding color under the driving of the anode 301 and the cathode 304. The encapsulation layer 104 may include a first encapsulation layer 401, a second encapsulation layer 402, and a third encapsulation layer 403 that are stacked on each other. The first encapsulation layer 401 and the third encapsulation layer 403 may include an inorganic material, and the second encapsulation layer 402 may include an organic material. The second encapsulation layer 402 is located between the first encapsulation layer 401 and the third encapsulation layer 403, so as to ensure that external moisture cannot enter the light-emitting structure layer 103.

In an exemplary embodiment, the organic light-emitting layer 303 may include a hole injection layer (HIL), a hole transport layer (HTL), an electron block layer (EBL), a light-emitting layer (EML), a hole block layer (HBL), an electron transport layer (ETL), and an electron injection layer (EIL) stacked on each other. In an exemplary embodiment, the hole injection layers of all the subpixels may be coupled together to form a common layer, the electron injection layers of all the subpixels may be coupled together to form a common layer, and the hole block layers of all the subpixels may be coupled together to form a common layer. The light-emitting layer of a subpixel and the electron blocking layer of another subpixel adjacent to the subpixel may overlap by a small amount or be isolated from each other.

Figure 2:
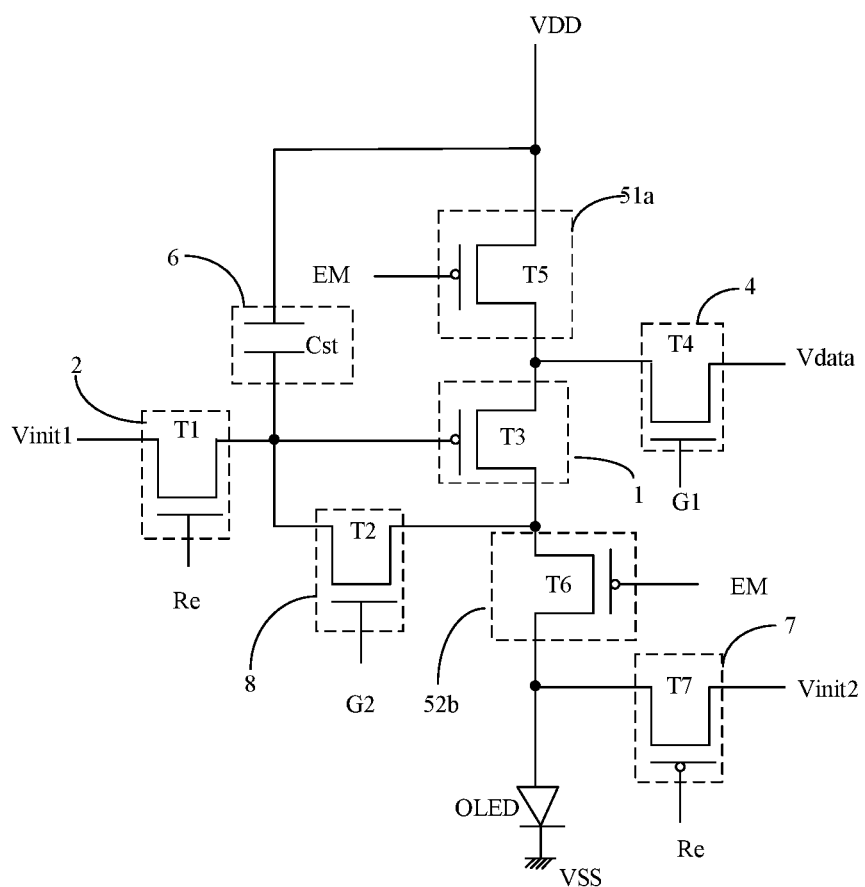
FIG. 2 is a schematic diagram showing an exemplary pixel driving circuit.
Figure 3:
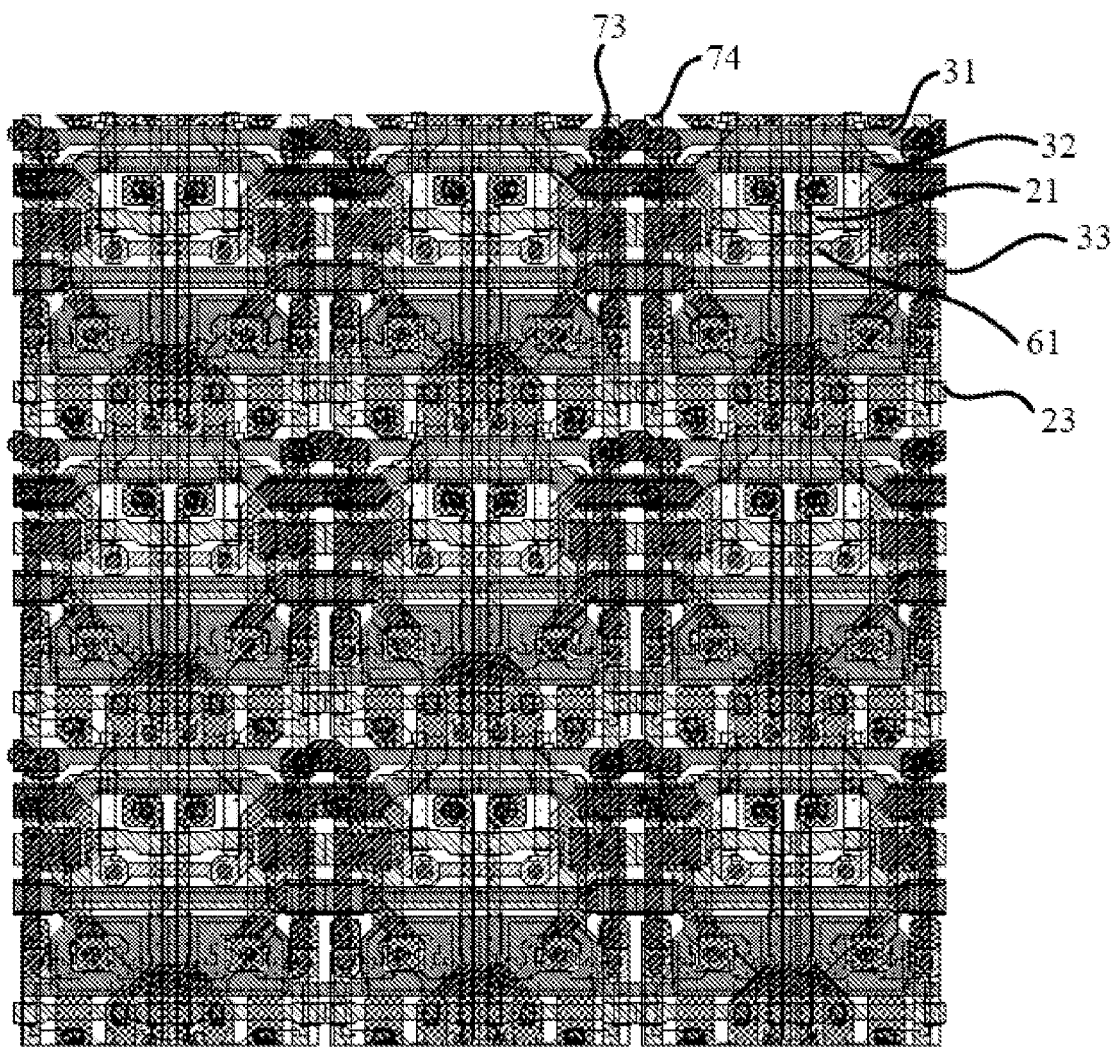
FIG. 3 is a schematic diagram showing a layout of a display substrate according to an embodiment of the present disclosure.

In an exemplary embodiment, the subpixels arranged in sequence in a horizontal direction form a pixel row, the subpixels arranged in sequence in a vertical direction form a pixel column, and a plurality of pixel rows and a plurality of pixel columns form a pixel array arranged in an array. FIG. 2 is a schematic diagram showing an exemplary pixel driving circuit. As shown in FIG. 2, the pixel driving circuit may include: a driving sub-circuit 1, a first reset sub-circuit 2, a data writing sub-circuit 4, a first light-emitting control sub-circuit 51a, a second light-emitting control sub-circuit 52b, a storage sub-circuit 6, a second reset sub-circuit 7, and a threshold compensation sub-circuit 8. The first reset sub-circuit 2 is coupled to a control terminal of the driving sub-circuit 1 and is configured to reset the control terminal of the driving sub-circuit 1 under the control of a reset control signal. The threshold compensation sub-circuit 8 is electrically coupled to the control terminal and a second terminal of the driving sub-circuit 1, respectively, and is configured to perform a threshold compensation process on the driving sub-circuit 1. The data writing sub-circuit 4 is electrically coupled to a first terminal of the driving sub-circuit 1 and is configured to write a data signal into the storage sub-circuit under control of a scan signal. The storage sub-circuit 8 is electrically coupled to the control terminal of the driving sub-circuit 1 and a first power supply terminal VDD respectively, and is configured to store a data signal. The first light-emitting control sub-circuit 51a is coupled to the first power supply terminal VDD and the first terminal of the driving sub-circuit 1 respectively, and is configured to connect or disconnect the driving sub-circuit 1 to or from the first power supply terminal VDD under control of an emission control signal. The second light-emitting control sub-circuit 52b is coupled to the second terminal of the driving sub-circuit 1 and a first electrode of the light-emitting device OLED respectively, and is configured to connect or disconnect the driving sub-circuit 1 to or from the light-emitting device OLED under control of the emission control signal. The second reset sub-circuit 7 is electrically coupled to the first electrode of the light-emitting device OLED, and is configured to reset the control terminal of the driving sub-circuit 1 and the first electrode of the light-emitting device OLED under the control of a reset control signal.

With continued reference to FIG. 2, the first reset sub-circuit 2 includes a first transistor T1, the threshold compensation sub-circuit 8 includes a second transistor T2, and the driving sub-circuit 1 includes a third transistor T3. A control electrode of the third transistor T3 serves as a control terminal of the driving sub-circuit 1, a first electrode of the third transistor T3 serves as a first terminal of the driving sub-circuit 1, and a second electrode of the third transistor T3 serves as a second terminal of the driving sub-circuit 1. The data writing sub-circuit 4 includes a fourth transistor T4, the storage sub-circuit 6 includes a storage capacitor Cst, the first light-emitting control sub-circuit 51a includes a fifth transistor T5, the second light-emitting control sub-circuit 52b includes a sixth transistor T6, and the second reset sub-circuit 7 includes a seventh transistor T7.

It should be noted that, according to the characteristics of the transistors, the transistors may include N-type transistors and P-type transistors. For clarity, in the embodiment as shown in FIG. 2, the pixel driving circuit includes the first transistor T1 and the second transistor T2 as N-type transistors (e.g., oxide thin film transistors) and the third transistor T3, the fourth transistor T4, the fifth transistor T5, the sixth transistor T6, and the seventh transistor T7 as P-type transistors (e.g., low temperature polysilicon thin film transistors).

In addition, the transistors in the embodiments of the present disclosure may be thin film transistors or field effect transistors or other switching devices having the same characteristics. Each of the transistors includes a first electrode, a second electrode and a control electrode. The control electrode is a gate electrode of the transistor, one of the first electrode and the second electrode is a source electrode of the transistor, and the other one is a drain electrode of the transistor. The source and drain electrodes of the transistor may be symmetrical in structure, so that there may be no difference in physical structure of the source and drain electrodes of the transistor. In the embodiments of the present disclosure, in order to distinguish transistors, except for a gate electrode as the control electrode, a first electrode serves as a source electrode, and a second electrode serves as a drain electrode, so that the source and the drain electrodes of all the transistors or part of the transistors in the embodiments of the present disclosure may be interchangeable as necessary.

With continued reference to FIG. 2, a drain electrode of the fourth transistor T4 is electrically coupled to a source electrode of the third transistor T3, a source electrode of the fourth transistor T4 is electrically coupled to the data line Data to receive the data signal Vdata, and a gate electrode of the fourth transistor T4 is electrically coupled to the first scan signal line G1 to receive the scan signal. A second electrode of the storage capacitor Cst is electrically coupled to the first power supply terminal VDD, and a first electrode of the storage capacitor Cst is electrically coupled to a gate electrode of the third transistor T3. A source electrode of the second transistor T2 is electrically coupled to a gate electrode of the third transistor T3, a drain electrode of the second transistor T2 is electrically coupled to a drain electrode of the third transistor T3, and a gate electrode of the second transistor T2 is electrically coupled to a second scan signal line G2 to receive a compensation control signal. A source electrode of the first transistor T1 is electrically coupled to the first initial signal line Vinit1 to receive a first reset signal, a drain electrode of the first transistor T1 is electrically coupled to the gate electrode of the third transistor T3, and a gate electrode of the first transistor T1 is electrically coupled to a reset signal terminal Re to receive a reset control signal. A drain electrode of the seventh transistor T7 is electrically coupled to the first initial signal line Vinit1 to receive the first reset signal, a source electrode of the seventh transistor T7 is electrically coupled to the first electrode of the light-emitting device OLED, and a gate electrode of the seventh transistor T7 is electrically coupled to the reset signal terminal Re to receive the reset control signal. A source electrode of the fifth transistor T5 is electrically coupled to the first power supply terminal VDD, a drain electrode of the fifth transistor T5 is electrically coupled to the source electrode of the third transistor T3, and a gate electrode of the fifth transistor T5 is electrically coupled to an enable signal terminal EM to receive an emission control signal. A source electrode of the sixth transistor T6 is electrically coupled to the drain electrode of the third transistor T3, a drain electrode of the sixth transistor T6 is electrically coupled to the first electrode of the light-emitting device OLED, and a gate electrode of the sixth transistor T6 is electrically coupled to the enable signal terminal EM to receive the emission control signal. The second electrode of the light-emitting device OLED is electrically coupled to the first power supply terminal VDD.

For example, one of a first power line and a second power line is a high voltage power line, and the other is a low voltage power line. For example, as shown in FIG. 2, the first power line is a voltage source for outputting a first constant voltage, which is a positive voltage; and the second power line may be a voltage source for outputting a second constant voltage, which is a negative voltage. For example, in some examples, the first power supply terminal VDD may be grounded.

With continued reference to FIG. 2, the gate electrode of the fifth transistor T5 and the gate electrode of the sixth transistor T6 may be respectively coupled to different signal lines, that is, coupled to different enable signal terminals for outputting the same signal; or alternatively, the gate electrode of the fifth transistor T5 and the gate electrode of the sixth transistor T6 may also be electrically coupled to the same signal line (e.g., the enable signal terminal EM) to receive the same signal (e.g., the emission control signal), in this case, the display substrate may only need one enable signal terminal, so that the number of terminals can be reduced.

It should be noted that, the fifth transistor T5 and the sixth transistor T6 are different types of transistors. For example, when the fifth transistor T5 is a P-type transistor and the sixth transistor T6 is an N-type transistor, the emission control signals received by the fifth transistor T5 and the sixth transistor T6 may also be different, which is not limited in the embodiment of the present disclosure. In the embodiment of the present disclosure, each of the gate electrodes of the fifth transistor T5 and the sixth transistor T6 is coupled to the enable signal terminal EM as an example for description.

With continued reference to FIG. 2, since the first transistor T1 and the seventh transistor T7 have opposite switching characteristics, the gate electrodes of the first transistor T1 and the seventh transistor T7 are electrically coupled to different reset signal lines. In some examples, in order to simplify wiring, a reset signal line connected to the gate electrode of the first transistor T1 in the current row may be used as a reset signal line connected to the gate electrode of the seventh transistor T7 in the previous row.

For example, the source electrode of the first transistor T1 and the drain electrode of the seventh transistor T7 are coupled to the first initial signal line Vinit1 and a second initial signal line Vinit2, respectively, and the first initial signal line Vinit1 and the second initial signal line Vinit2 may be direct current (DC) reference voltage terminals to output a constant DC reference voltage. The first initial signal line Vinit1 and the second initial signal line Vinit2 may be the same. For example, the source electrode of the first transistor T1 and the drain electrode of the seventh transistor T7 are coupled to the same initial signal line. The first and second initial signal lines Vinit1 and Vinit2 may be high voltage terminals or low voltage terminals, as long as the first and second initial signal lines Vinit1 and Vinit2 may respectively provide a first reset signal and a first reset signal to reset the gate electrode of the third transistor T3 and the first electrode of the light-emitting device, which is not limited in the present disclosure. For example, both of the source electrode of the first transistor T1 and the drain electrode of the seventh transistor T7 may be coupled to a reset power signal line Vinit.

In addition, the first reset sub-circuit 2, the threshold compensation sub-circuit 8, the driving sub-circuit 1, the data writing sub-circuit 4, the first light-emitting control sub-circuit 51a, the second light-emitting control sub-circuit 52b, the second reset sub-circuit 7 and the storage sub-circuit 6 in the pixel circuit shown in FIG. 2 are for illustrative purposes only, and specific structures of sub-circuits such as the first reset sub-circuit 2, the threshold compensation sub-circuit 8, the driving sub-circuit 1, the data writing sub-circuit 4, the first light-emitting control sub-circuit 51a, the second light-emitting control sub-circuit 52b, the second reset sub-circuit 7 and the storage sub-circuit 6 may be selected as needed, which are not particularly limited in the embodiment of the present disclosure.

It should be noted that, in the embodiment of the present disclosure, in addition to the 7T1C structure (i.e., having seven transistors and one capacitor) shown in FIG. 2, the pixel circuit of the subpixel may also be a circuit structure including various numbers of transistors and capacitors, such as a 7T2C structure, a 6T1C structure, a 6T2C structure, or a 9T2C structure, which is not limited in the embodiment of the present disclosure.

The light-emitting device in the embodiment of the present invention may be an organic light-emitting diode (OLED). Of course, the light-emitting device may also be a micro inorganic light-emitting diode, and further, may be a current type light-emitting diode, such as a micro light-emitting diode (micro LED) or a mini light-emitting diode (Mini LED). One of the first electrode and the second electrode of the light-emitting device is an anode, and the other is a cathode; in an embodiment of the present invention, the first electrode of the light-emitting device OLED is an anode, and the second electrode is a cathode.

In a first aspect, as shown in FIG. 3 to FIG. 20, an embodiment of the present disclosure provides a display substrate, which includes a base substrate, a driving circuit layer disposed on the base substrate, and a light-emitting structure layer disposed on a side of the driving circuit layer away from the base substrate. The driving circuit layer includes a plurality of pixel driving circuits. The light-emitting structure layer includes a plurality of light-emitting devices, and each of the light-emitting devices may be electrically coupled to a corresponding pixel driving circuit. At least part of transistors in each of the pixel driving circuits are oxide thin film transistors, and at least part of transistors are low-temperature polycrystalline silicon thin film transistors. The pixel driving circuit in the embodiment of the present disclosure may adopt the pixel driving circuit shown in FIG. 2, that is, each of the first transistor T1 and the second transistor T2 is an N-type oxide thin film transistor, and each of the third transistor T3, the fourth transistor T4, the fifth transistor T5, the sixth transistor T6, and the seventh transistor T7 is a P-type low temperature polysilicon thin film transistor.

Since the transistors, especially the driving transistor (i.e., the third transistor T3 in the circuit of FIG. 2), in the pixel driving circuit are prone to produce a potential drift, a shield electrode layer is disposed on the base substrate to prevent the driving transistor from being interfered, so that an operating voltage of the driving transistor is more stable. In order to achieve the above-mentioned effects, the shield electrode layer is disposed on a side of the driving circuit layer proximal to the base substrate, and an orthographic projection of the shield electrode layer on the base substrate at least partially overlaps orthographic projections of the third transistors T3 of at least part of the pixel driving circuits of the plurality of pixel driving circuits of the driving circuit layer on the base substrate. Further, the shield electrode layer covers the entire active layers of the third transistors T3. The shield electrode layer is electrically coupled to a constant voltage terminal, through which a constant voltage may be input to the shield electrode layer, so as to prevent the driving transistor (i.e., the third transistor T3) from being interfered.

It should be noted that, in the display substrate in the embodiment, the constant voltage terminal may be any voltage terminal for outputting a constant voltage, such as a first power supply terminal VDD, a second power supply terminal VSS, a reference voltage terminal, etc. The shield electrode layer may be coupled to the constant voltage terminal via a signal line. Correspondingly, when the constant voltage terminal is a first power supply terminal VDD, the shield electrode layer is coupled to the first power supply terminal VDD via the first power line. When the constant voltage terminal is a second power supply terminal VSS, the shield electrode layer is coupled to the second power supply terminal VSS via the second power line. When the constant voltage terminal is a reference voltage terminal, the shield electrode layer is coupled to the reference voltage terminal via a first reference voltage line Vref.

In some examples, the shield electrode layer may cover all of the third transistors T3 of the pixel driving circuits in the driving circuit layer, or alternatively may cover only the third transistors T3 of some pixel driving circuits. Further, the shield electrode layer may be a planar electrode and include a plurality of shield electrodes 81. The plurality of shield electrodes 81 are located on a side of the active layer of the third transistor T3 of each of the plurality of pixel driving circuits proximal to the base substrate. An orthographic projection of each of the shield electrodes 81 on the base substrate covers an orthographic projection of the active layer of the third transistor T3 of a corresponding pixel driving circuit on the base substrate. In other words, the shield electrodes 81 are in one-to-one correspondence with the active layers of the third transistors T3.

Figure 5:
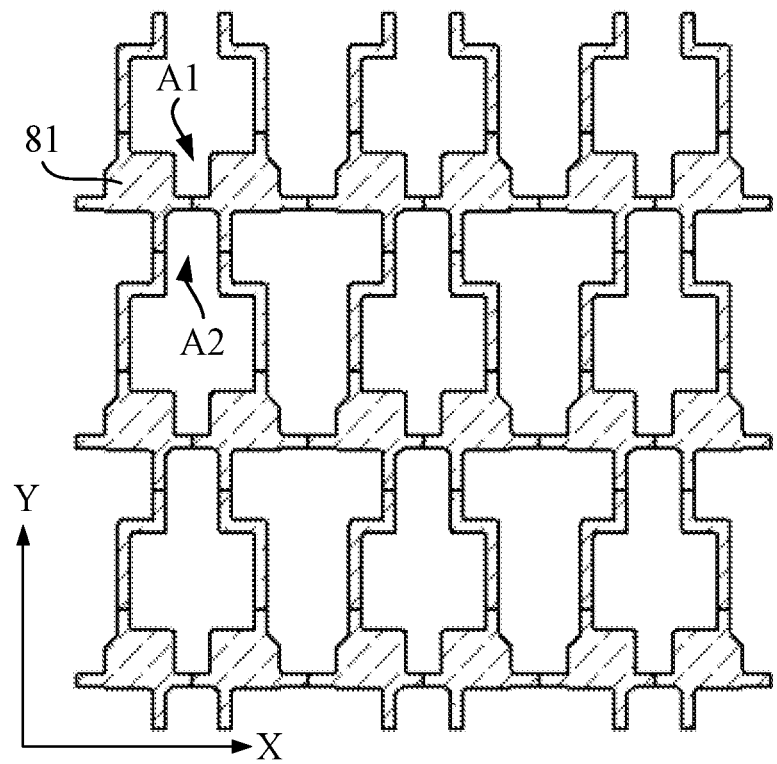
FIG. 5 is a schematic diagram showing a layout of a shield electrode layer of a display substrate according to an embodiment of the present disclosure.

As shown in FIG. 5, in the display substrate in the present disclosure, the plurality of shield electrodes 81 may be arranged in various ways. For example, the plurality of shield electrodes 81 may be arranged in an array, that is, the plurality of shield electrodes 81 include a plurality of rows of shield electrodes 81 arranged along a first direction X and a plurality of columns of shield electrodes 81 arranged along a second direction Y. The shield electrodes 81 arranged along the first direction X are electrically coupled to each other, and the shield electrodes 81 arranged along the second direction Y are electrically coupled to each other, so that the plurality of shield electrodes 81 may be coupled all together to form a one-piece mesh structure, thereby reducing the overall resistance of the shield electrode layer, and reducing an attenuation of the constant voltage as an increase of a transmission distance for the constant voltage after the shield electrode layer is input with the constant voltage. The first direction X intersects the second direction Y, and in some embodiments the first direction X is perpendicular to the second direction Y. For convenience of description, an embodiment in which the first direction X is perpendicular to the second direction Y will be illustrated below.

In some examples, the active layer of the third transistor T3 includes a channel region and first and second regions located at both sides of the channel region. An orthographic projection of each of the shield electrodes 81 on the base substrate may only cover an orthographic projection of the channel region of the third transistor T3 of a corresponding pixel driving circuit on the base substrate and does not overlap orthographic projections of the first and second regions of the active layer of the third transistor T3 on the base substrate. That is, an area of a wiring region of the shield electrode 81 is decreased in the present embodiment, such that the shield electrode may only cover the channel region of the third transistor T3. Since the area of the wiring region of the shield electrode 81 is decreased, a parasitic capacitance between the shield electrode 81 and other conductive film layers in the display substrate can be reduced, and the transmittance of the panel can be improved.

It should be noted that above embodiment in which the shield electrode layer covers the third transistor T3 is illustrated, which is not limited in the present disclosure, alternatively the shield electrode layer may cover other transistors or all transistors in the pixel driver circuit, which is not limited in the present disclosure.

In the display substrate in the present disclosure, based on the above description, the constant voltage is input to the shield electrode layer, so that the driving transistor can be prevented from being interfered. There are many ways to supply a constant voltage. For example, the shield electrode layer is electrically coupled to the first power line via the through-hole, so as to supply a first constant power voltage to the shield electrode layer.

Figure 13:
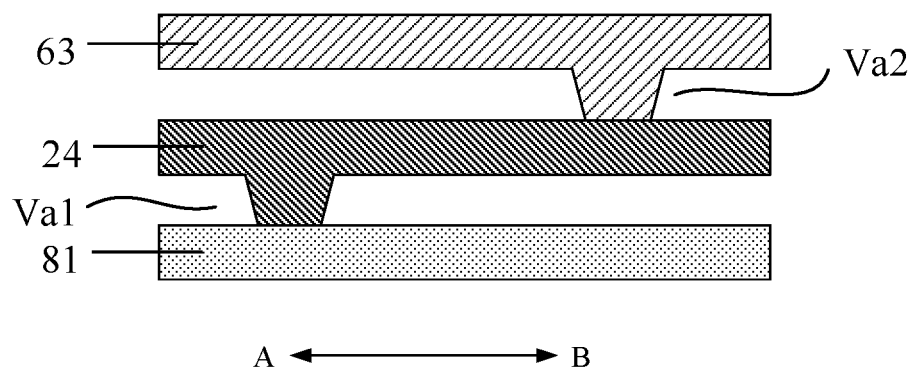
FIG. 13 is a cross-sectional view taken along a line A-B in FIG. 12.

In some examples, the driving circuit layer includes a plurality of circuit units. At least one of the circuit units includes a pixel driving circuit, a first shield layer connection electrode 24, and a second connection electrode 63. Referring to FIG. 13, the shield electrode layer is coupled to the first shield layer connection electrode 24 via a through-hole (e.g., a first shield layer connection through-hole Va1), the first shield layer connection electrode 24 is coupled to the second connection electrode 63 via a through-hole (e.g., a second shield layer connection through-hole Va2), and the second connection electrode 63 is coupled to the first power line 71 via a through-hole.

Further, the shield electrode layer may include a plurality of shield electrodes 81, and the shield electrodes 81 form a mesh structure as described above. In an embodiment in which the shield electrode layer is coupled to the first power supply terminal VDD (or to another constant voltage terminal) via the first power line (or via other signal line for transmitting a constant voltage) 71, the first power voltage may be input to only one of the shield electrodes 81; or alternatively the first power voltage may be input to the plurality of shield electrodes 81, so as to increase the voltage uniformity of the shield electrode layer. An embodiment in which the first power voltage is input to each of the shield electrodes 81 is illustrated, each of the shield electrodes 81 is coupled to a corresponding first shield layer connection electrode 24 via a through-hole (i.e., the first shield layer connection through-hole Va1), and the corresponding first shield layer connection electrode 24 is coupled to a corresponding second connection electrode 63 via a through-hole (i.e., a second shield layer connection through-hole Va2). The second connection electrodes located in the same column of circuit units may be coupled to the same first power line 71. In other words, at least one second connection electrode 63 is coupled to a corresponding first power line 71 via a through-hole (i.e., an eleventh through-hole V11), and the first power line 71 is coupled to the first power supply terminal VDD.

Figure 7:
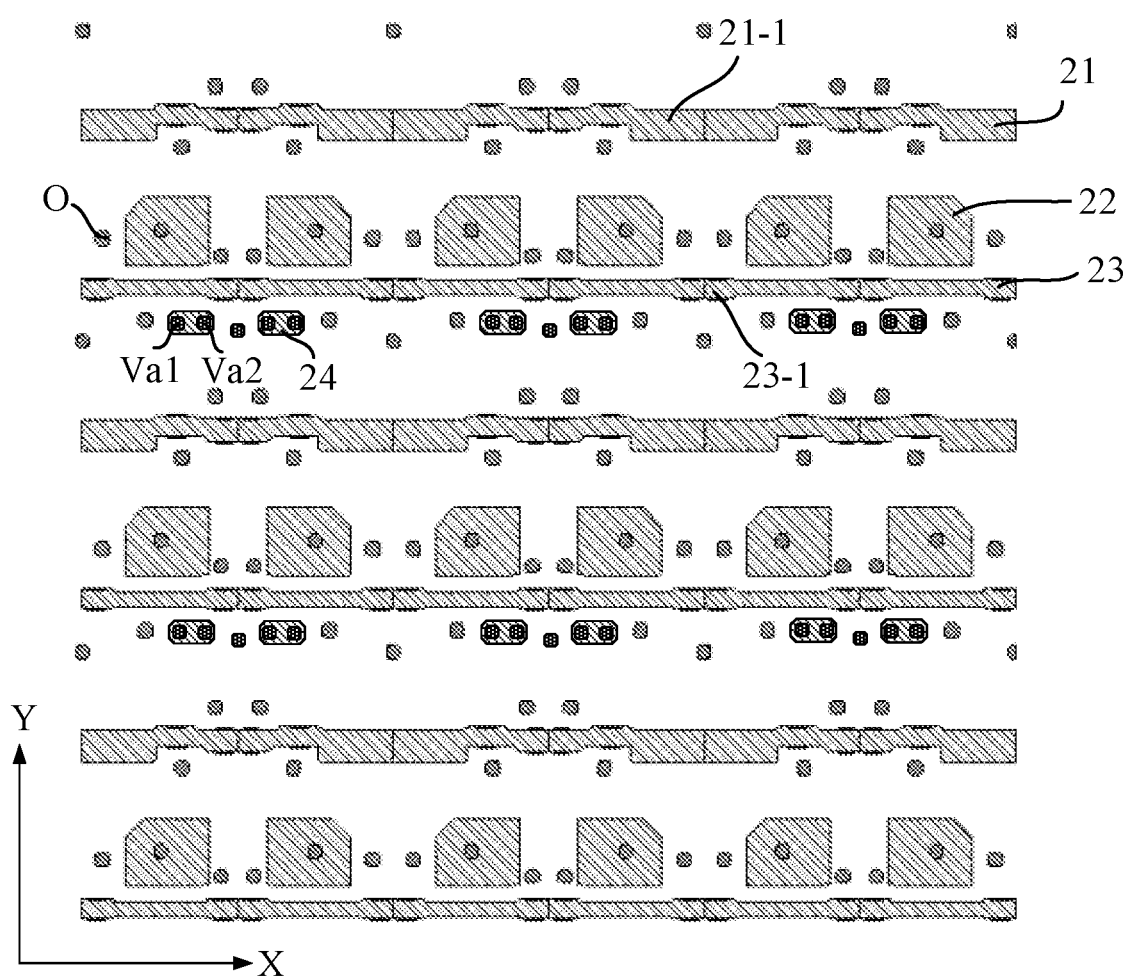
FIG. 7 is a schematic diagram showing a layout of a first conductive layer of a display substrate according to an embodiment of the present disclosure.

In some examples, referring to FIG. 7 and FIG. 13, for one circuit unit, an orthographic projection of the through-hole (i.e., the first shield layer connection through-hole Va1) connecting the shield electrode 81 and the first shield layer connection electrode 24 on the base substrate does not overlap an orthographic projection of the through-hole (i.e., the second shield layer connection through-hole Va2) connecting the first shield layer connection electrode 24 and the second connection electrode 63 on the base substrate, that is, the shield electrode 81, the first shield layer connection electrode 24, and the second connection electrode 63 are successively coupled via through-holes at different positions, so as to reduce the connection failure.

Figure 17:
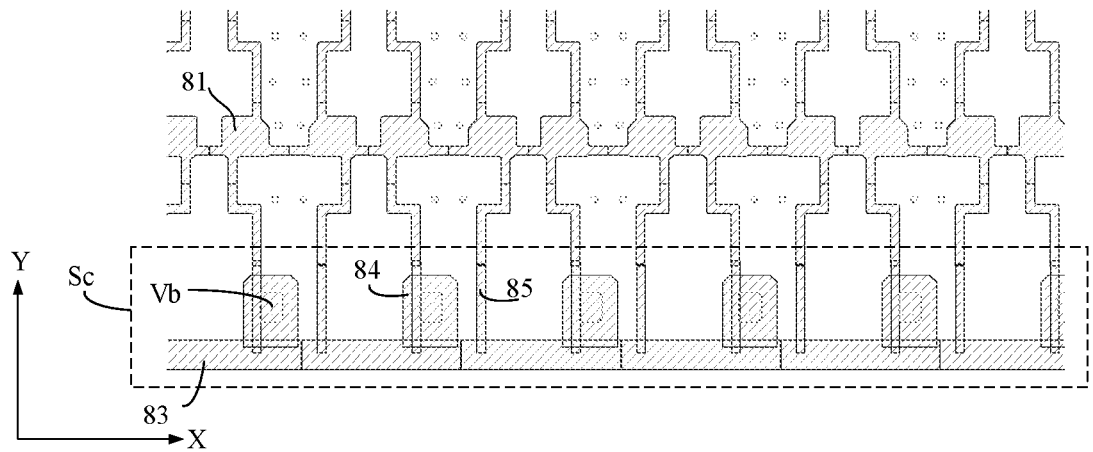
FIG. 17 is a schematic diagram showing a layout of a frame region of a shield electrode layer of a display substrate according to an embodiment of the present disclosure.
Figure 18:
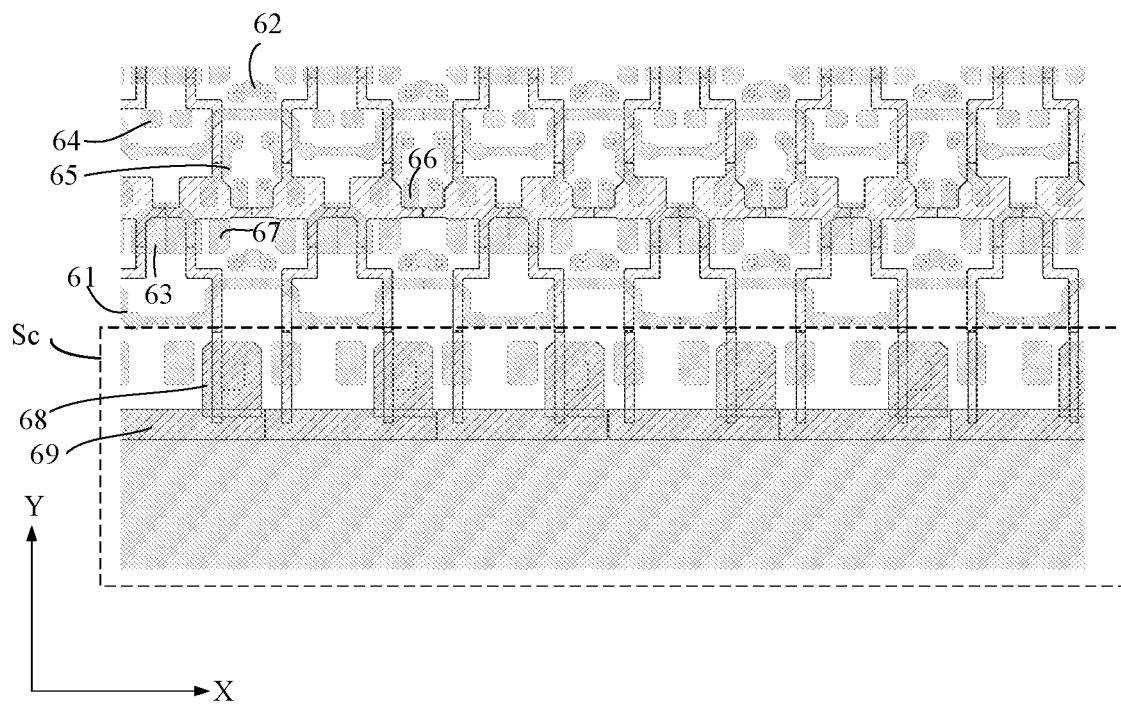
FIG. 18 is a schematic diagram showing a layout obtained after superposition of a frame region of a shield electrode layer and a frame region of a fourth conductive layer of a display substrate according to an embodiment of the present disclosure.
Figure 19:
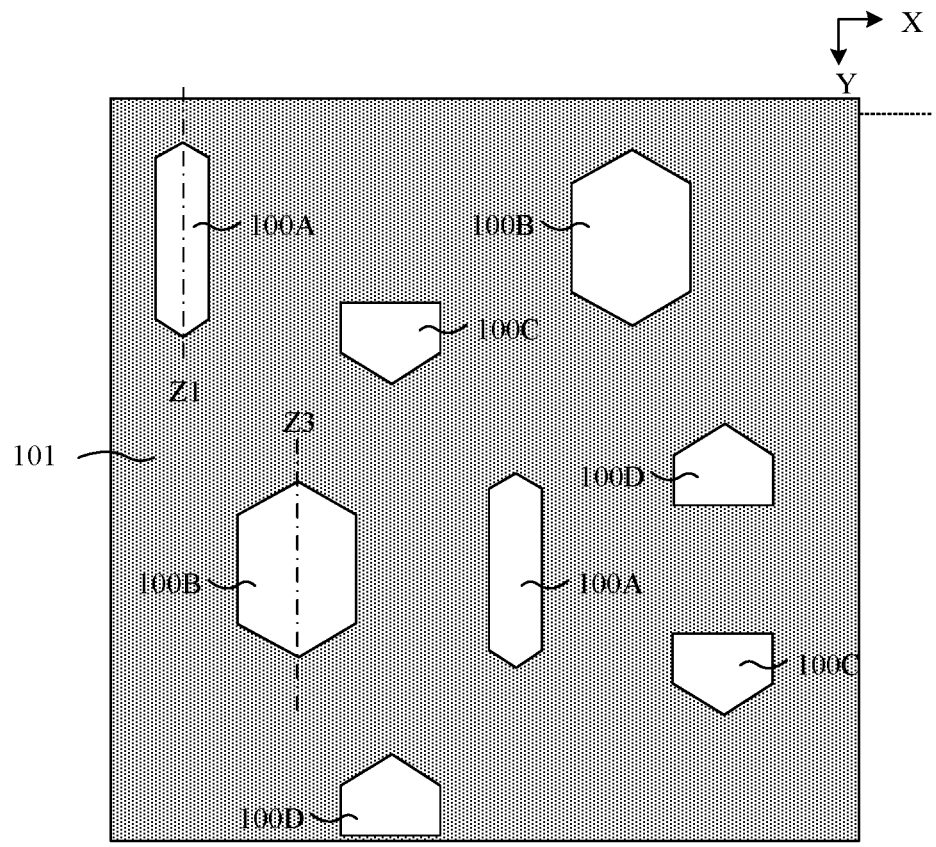
FIG. 19 is a schematic diagram showing a layout of a pixel definition layer of a display substrate according to an embodiment of the present disclosure.

In some examples, referring to FIG. 17 to FIG. 18, the shield electrode layer may also be coupled to other constant voltage terminals for outputting a constant voltage. For example, the shield electrode layer is coupled to the second power supply terminal VSS via the second power line 69 to receive the second power voltage. Specifically, the display substrate includes a display region (not shown in the drawings) and a frame region Sc surrounding the display region. The frame region Sc includes at least one second power line 69. A portion of the shield electrode layer located in the frame region Sc is electrically coupled to the at least one second power line 69 via a through-hole (i.e., a third shield layer connection through-hole Vb), and the second power line 69 is coupled to the second power supply terminal VSS to receive the second power voltage. When the second power voltage is input to the shield electrode layer, the first power voltage may shift toward a positive voltage value, so that the difference between the first power voltage and the second power voltage can be decreased, and the power consumption can be further reduced.

It should be noted that one of the first power line and the second power line is a high voltage power line, and the other is a low voltage power line. For example, as shown in FIG. 2, a first constant power voltage is output from a voltage source via the first power line, with the first power voltage being a positive voltage; and a second constant power voltage is output from a voltage source via the second power line, with the second power voltage being a negative voltage. For example, in some examples, the second power supply terminal VSS coupled to the second power line may be grounded.

As shown in FIG. 17, in some examples, the shield electrode layer includes a plurality of second shield layer connection electrodes 84 in the frame region Sc and a plurality of shield electrodes 81 in the display region. The plurality of shield electrodes 81 are electrically coupled to each other to form a one-piece structure. The plurality of shield electrodes 81 are electrically coupled to the plurality of second shield layer connection electrodes 84 respectively, and the plurality of second shield layer connection electrodes 84 are electrically coupled to the at least one second power line 69 via the through-holes (i.e., the third shield layer connection through-holes Vb).

In some examples, as shown in FIG. 17 and FIG. 18, the shield electrodes 81 arranged in the first direction X are electrically coupled to each other and the shield electrodes 81 arranged in the second direction Y are electrically coupled to each other to form a mesh structure. The second shield layer connection electrodes 84 in the frame region Sc are arranged in the first direction X and electrically coupled to each other. A row of the shield electrodes 81 closest to the frame region Sc are electrically coupled to the second shield layer connection electrodes 84 in the frame region Sc via first connection lines 85, with the first connection lines 85 being connected to the row of the shield electrodes 81 closest to the frame region Sc and extending in the second direction Y. The plurality of second shield layer connection electrodes 84 are electrically coupled to at least one second power line 69 via the through-holes (i.e., third shield layer connection through-holes Vb).

In some examples, with continued reference to FIG. 17 and FIG. 18, the shield electrode layer may further include a connection electrode bar 83 extending along the first direction X and disposed in the frame region. The plurality of second shield layer connection electrodes 84 may be coupled to the connection electrode bar 83, and the connection electrode bar 83 is further coupled to the plurality of transfer electrodes 68 disposed in the same layer as the second power line 69 and electrically coupled to the second power line 69.

Similarly, the shield electrode layer may be further coupled to the reference voltage terminal via the first reference voltage line Vref to receive the first reference voltage. In the embodiment, similar to the embodiment in which the shield electrode layer is coupled to the second power line, the first reference voltage line Vref may be disposed in the frame region Sc and coupled to the shield electrodes 81 via the second shield layer connection electrodes 84, which will not described herein again.

Figure 6:
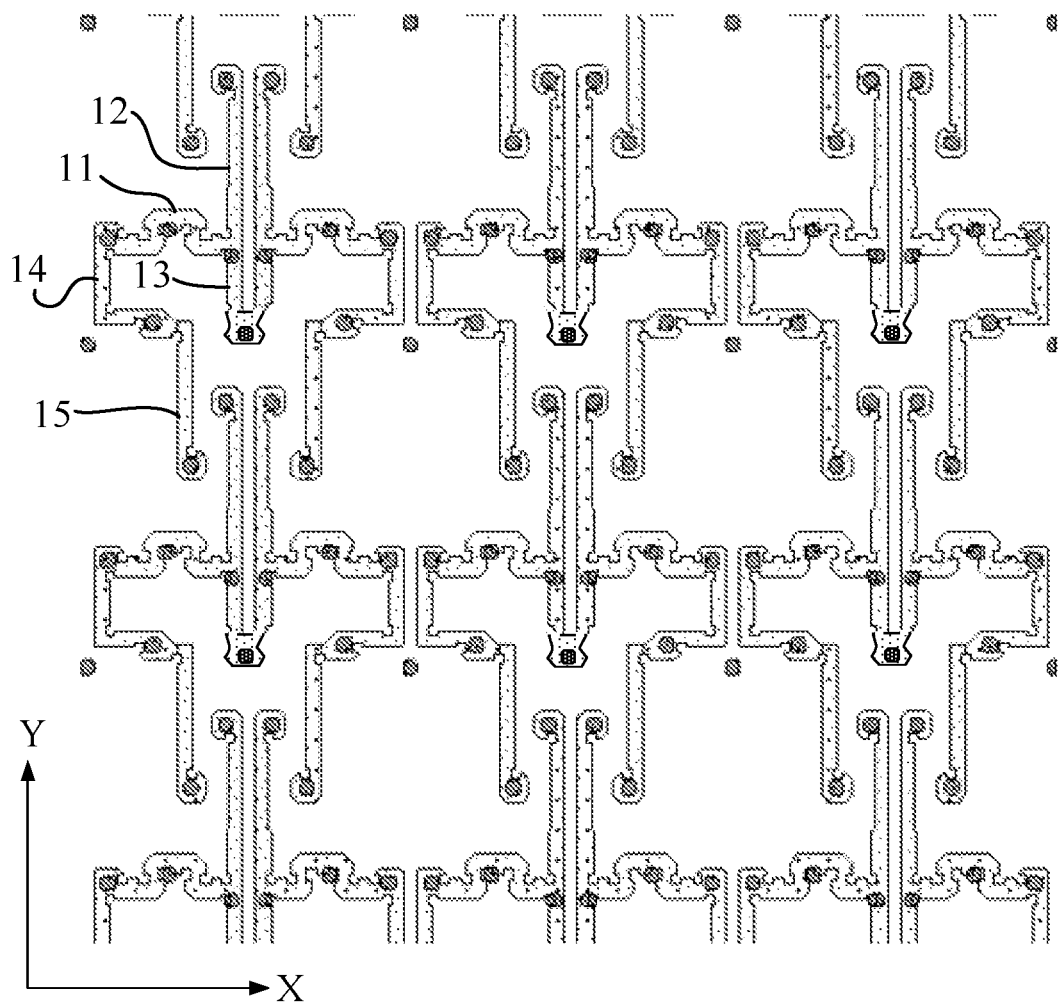
FIG. 6 is a schematic diagram showing a layout of a first semiconductor layer of a display substrate according to an embodiment of the present disclosure.

In some examples, as shown in FIG. 5 to FIG. 7, in order to further reduce the area of the wiring region of the shield electrode layer, one first notch portion A1 is formed between every two adjacent shield electrodes 81 in the first direction X, and the first notch portion A1 may expose the active layer of the fourth transistor T4. That is, an orthographic projection of the first notch portion A1 on the base substrate does not overlap an orthographic projection of the active layer of the fourth transistor T4 of a corresponding pixel driving circuit on the base substrate, such that the gate electrode of the fourth transistor T4 or other signal lines passing through the region may not overlap the first notch portion A1, and thus, parasitic capacitance cannot be generated. Similarly, one second notch portion A2 is disposed between two adjacent shield electrodes in the second direction Y, and the second notch portion A2 may expose the active layer of the fifth transistor T5. That is, an orthographic projection of the second notch portion on the base substrate does not overlap an orthographic projection of the active layer of the fifth transistor T5 of the corresponding pixel driving circuit on the base substrate, such that the gate electrode of the fifth transistor T5 or other signal lines passing through the region may not overlap the second notch portion A2, thereby avoiding the generation of parasitic capacitance, and increasing the transmittance of the panel.

In some examples, referring to FIG. 5 to FIG. 7, an orthographic projection of one shield electrode 81 on the base substrate covers an orthographic projection of the first electrode 22 of the storage capacitor Cst of a corresponding pixel driving circuit on the base substrate, and the first electrode 22 overlaps the active layer of the third transistor T3, so that the first electrode 22 may be used as the gate electrode of the third transistor T3. Further, an edge of an orthographic projection of the shield electrode 81 on the base substrate is conformal to an edge of an orthographic projection of the first electrode 22 on the base substrate, that is, the shield electrode 81 has the same shape as the first electrode 22 and has the substantially same area of region where the first electrode 22 is located. It should be noted that the first electrode 22 of the storage capacitor may have a rectangular shape, and corners of the rectangular shape may be chamfered, so that the shield electrode 81 may have a rectangular shape, and the corners of the rectangular shape may be chamfered.

Figure 8:
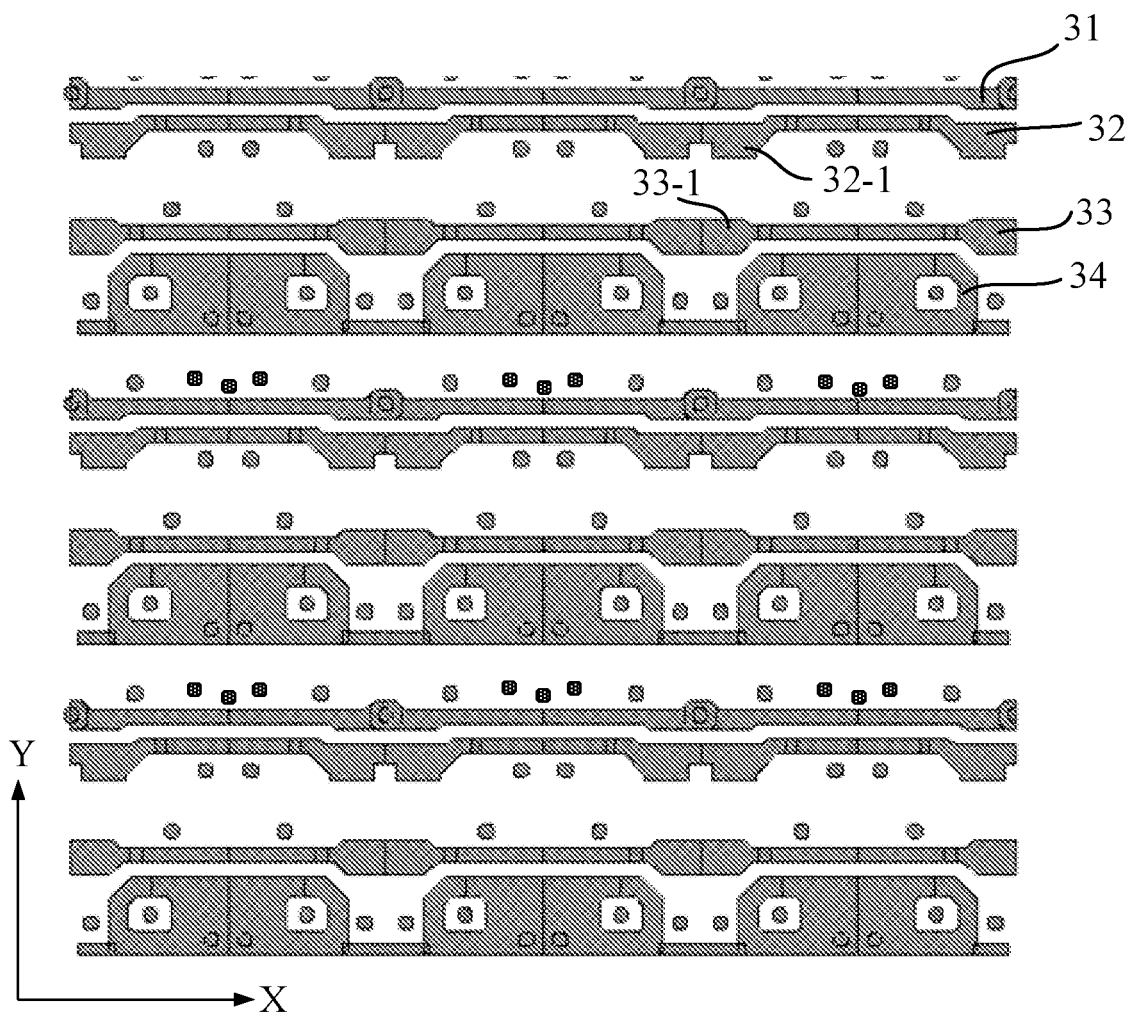
FIG. 8 is a schematic diagram showing a layout of a second conductive layer of a display substrate according to an embodiment of the present disclosure.
Figure 14:
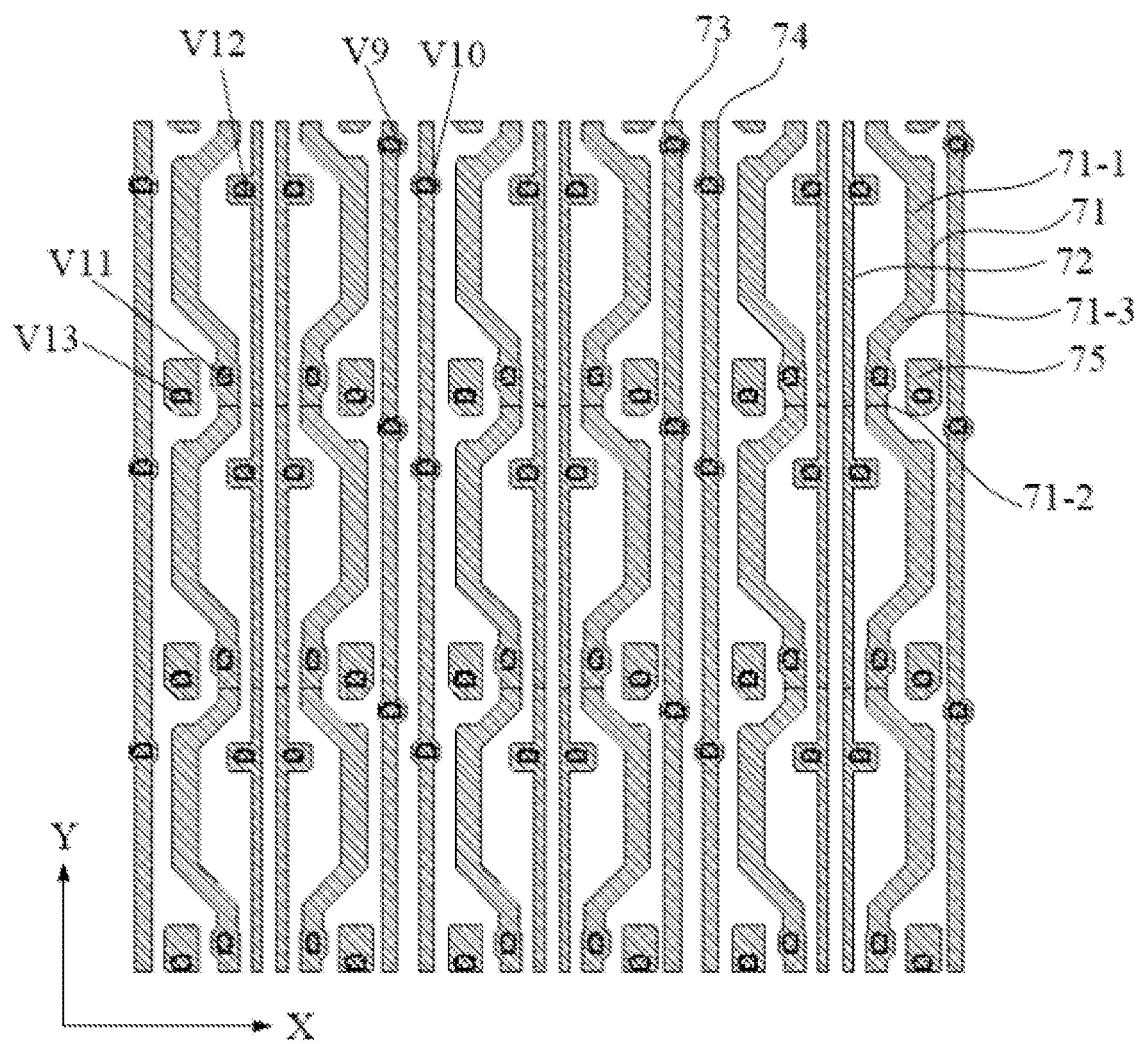
FIG. 14 is a schematic diagram showing a layout of a fifth conductive layer of a display substrate according to an embodiment of the present disclosure.

In particular, in the embodiment of the present disclosure, at least one circuit unit further includes a first initial signal line and a second initial signal line. At least one of the first initial signal line and the second initial signal line includes a sub-signal line extending in a first direction X and a sub-signal line extending in a second direction Y, with the first direction X and the second direction Y intersecting with each other. As shown in FIG. 8 and FIG. 14, for example, the first initial signal line includes a first sub-signal line 31 extending in the first direction X and a second sub-signal line 73 extending in the second direction Y, and the first sub-signal line 31 and the second sub-signal line 73 intersect with each other and are electrically coupled to one another; and/or, the second initial signal line includes a third sub-signal line 61 extending along the first direction X and a fourth sub-signal line 74 extending along the second direction Y, and the third sub-signal line 61 and the fourth sub-signal line 74 intersect with each other and are electrically coupled to one another. In the following description, an embodiment in which the first initial signal line includes the first sub-signal line 31 and the second sub-signal line 73 both extending in the first direction X, and the second initial signal line includes the third sub-signal line 61 and the fourth sub-signal line 74 both extending in the first direction X is illustrated as an example.

Figure 4:
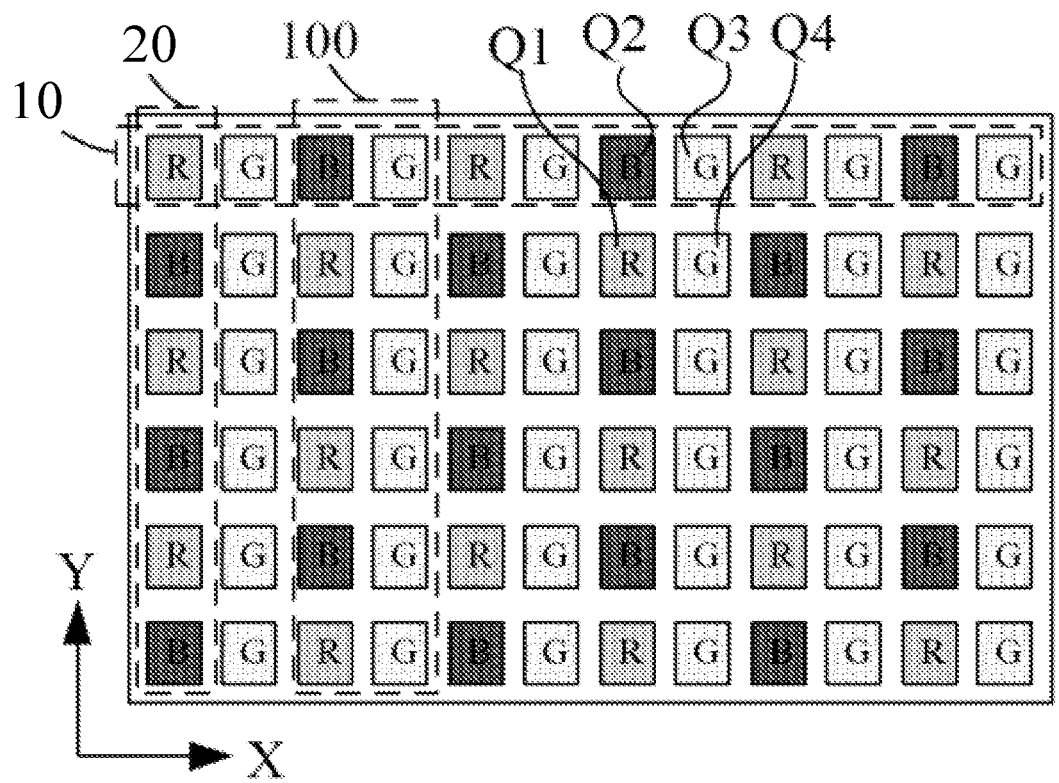
FIG. 4 is a schematic diagram showing a pixel arrangement of a display substrate according to an embodiment of the present disclosure.

In some examples, as shown in FIG. 4, the plurality of circuit units of the driving circuit layer are arranged in the first direction X to form a plurality of row units 10, and the plurality of row units 10 are arranged in the second direction Y. The plurality of circuit units of the driving circuit layer are arranged in the second direction Y to form a plurality of column units 20, and the plurality of column units 20 are arranged in the first direction X. The first sub-signal line 31 of the first initial signal line and the third sub-signal line 61 of the second initial signal line may be disposed for each of the row units 10. In at least one column unit 20, the second sub-signal lines 73 of the first initial signal lines of the adjacent circuit units are coupled to each other, and the fourth sub-signal lines 74 of the second initial signal lines are coupled to each other. The second sub-signal line 73 is formed between adjacent column units 20, and similarly the fourth sub-signal line 74 is also formed between adjacent column units 20. That is, at least one column unit 20 is formed between two adjacent second sub-signal lines 73 in the first direction X, and at least one column unit 20 is formed between two adjacent fourth sub-signal lines 74 in the first direction X.

In some examples, as shown in FIG. 4, the plurality of subpixels in the display substrate may include a red subpixel R emitting red light, a blue subpixel B emitting blue light, a first green subpixel G1 emitting green light, and a second green subpixel G2 emitting green light. The red subpixel R may include a red light-emitting device emitting red light and a first circuit unit Q1 coupled to the red light-emitting device, the blue subpixel B may include a blue light-emitting device emitting blue light and a second circuit unit Q2 coupled to the blue light-emitting device, the first green subpixel G1 may include a first green light-emitting device emitting green light and a third circuit unit Q3 coupled to the first green light-emitting device, and the second green subpixel G2 may include a second green light-emitting device emitting green light and a fourth circuit unit Q4 coupled to the second green light-emitting device. The first circuit unit Q1, the second circuit unit Q2, the third circuit unit Q3 and the fourth circuit unit Q4 form one circuit unit group, and four circuit units in at least one circuit unit group may be arranged in a square. That is, four circuit units are arranged in two row units 10 and two column units 20. The subpixels in the present disclosure refer to regions where the light-emitting devices are located; and the circuit units in the present disclosure refer to regions where the pixel driving circuits are located. In an exemplary embodiment, the sub-pixel and the circuit unit may or may not be in one-to-one correspondence with each other in position.

In some examples, the plurality of column units 20 may include a first column unit 20 and a second column unit 20, with the first column unit 20 referring to a column including a plurality of first and second circuit units Q1 and Q2, and the second column unit 20 referring to a column including a plurality of third and fourth circuit units Q3 and Q4. The first and second circuit units Q1 and Q2 in the first column unit 20 are alternately arranged along the second direction Y, and the third and fourth circuit units Q3 and Q4 in the second column unit 20 are alternately arranged along the second direction Y.

In one example, the second sub-signal line 73 of the first initial signal line and the fourth sub-signal line 74 of the second initial signal line may be disposed in the first column unit 20. For example, the $N^{th}$ column unit 20 and the $(N+2)^{th}$ column unit 20 may be the first column unit 20, and the $(N+1)^{th}$ column unit 20 and the $(N+3)^{th}$ column unit 20 may be the second column unit 20, and second initial signal lines may be disposed in the $N^{th}$ column unit 20, the $(N+2)^{th}$ column unit 20, and the $(N+4)^{th}$ column unit 20, . . . , that is, the second initial signal lines are repeatedly arranged every other second column unit 20.

In another example, the second sub-signal line of the first initial signal line and the fourth sub-signal line 74 of the second initial signal line may be disposed in the second column unit 20. For example, the $N^{th}$ column unit 20 and the $(N+2)^{th}$ column unit 20 are the first column unit 20, and the $(N+1)^{th}$ column unit 20 and the $(N+3)^{th}$ column unit 20 may be the second column unit 20. The second initial signal lines may be disposed in the $(N+1)^{th}$ column unit 20, the $(N+3)^{th}$ column unit 20, the $(N+5)^{th}$ column unit 20, . . . , the second initial signal lines are repeatedly arranged every other first column unit 20.

In still another example, the second sub-signal line of the first initial signal line and the fourth sub-signal line 74 of the second initial signal line may be disposed in the first column unit 20 and the second column unit 20, respectively.

In some examples, as shown in FIG. 14, the circuit unit of the display substrate includes not only the above-described structure but also a first power line 71 and a data line 72. The first power line 71 is configured to receive a power supply signal (i.e., a first power voltage), and the data line 72 is configured to receive a data voltage signal. In circuit units disposed adjacent to each other in at least one column unit 20, the first power lines 71 are coupled to each other, and the data lines 72 are coupled to each other. The first power line 71 includes a first side (i.e., the left side) and a second side (i.e., the right side) disposed oppositely to each other in the first direction X. The data line 72 in a first column unit of the adjacent column units 20 is on the first side (i.e., on the left side) of the first power line 71 of the first column unit 20. The data line 72 in a second column unit of the adjacent column units 20 is on the second side (i.e., on the right side) of the first power line 71 of the second column unit. Alternatively, the data line 72 in a first column unit of the adjacent column units 20 is located on the second side of the first power line 71 of the first column unit, and the data line 72 in a second column unit of the adjacent column units 20 is located on the first side of the first power line 71 of the second column unit 20. Meanwhile, in the column unit 20, the second sub-signal line 73 of the first initial signal line and the fourth sub-signal line 74 of the second initial signal line are located on the same side of the first power line 71 in the first direction X and are located on a different side of the first power line 71 in the first direction X from the data line 72. That is, in the column unit 20, the second sub-signal line 73 and the fourth sub-signal line 74 are located on the first side of the first power line 71, and the data line 72 is located on the second side of the first power line 71; or alternatively the second sub-signal line 73 and the fourth sub-signal line 74 are located on the second side of the first power line 71, and the data line 72 is located on the first side of the first power line 71.

In some examples, two data lines 72 are disposed between the first power line 71 in the $N^{th}$ column unit 20 and the first power line 71 in $(N+1)^{th}$ column unit 20 (i.e., one of the data lines 72 is in the $N^{th}$ column unit 20 and the other is in the $(N+1)^{th}$ column unit 20). A second sub-signal line 73 and a fourth sub-signal line 74 (in the $(N+1)^{th}$ column unit 20) are disposed between the first power line 71 in $(N+1)^{th}$ column unit 20 and the first power line 71 in $(N+2)^{th}$ column unit 20.

In some examples, as shown in FIG. 4 and FIG. 14, the driving circuit layer includes a plurality of structure units 100 arranged along the first direction X. Each of the structure units 100 includes two adjacent column units 20. For example, each of the structure units 100 includes a first column unit 20 and a second column unit 20 adjacent to each other. In some examples, the first power lines 71 in two column units 20 adjacent to each other in the first direction X are arranged in mirror symmetry with respect to the second direction Y as a symmetry axis. That is, two first power lines 71 in each structure unit 100 are mirror symmetric. The first power line 71 in the circuit unit includes a first line segment 71-1 and a second line segment 71-2 both extending in the second direction Y and electrically coupled to each other. In each of the column units 20, the first line segment 71-1 of the first power line 71 of one of the two adjacent circuit units is electrically coupled to the second line segment 71-2 of the other one of the two adjacent circuit units. In the structure unit 100, a distance between the second line segments 71-2 adjacently arranged in the first direction X is smaller than a distance between the first line segments 71-1 adjacently arranged in the first direction X. In each of the structure units 100, the second line segments 71-2 adjacent to each other in the first direction X are short-circuited, and in this case the first power lines 71 form a conductive mesh structure, thereby reducing the resistance.

In addition, it should be noted that the first line segment 71-1 and the second line segment 71-2 of the first power line 71 in each of the circuit units are electrically coupled to each other via a connection line segment 71-3, and an extension direction of the connection line segment 71-3 forms an included angle smaller than 90° with the second direction Y, for example, the included angle is 30°, 45°, 60° or the like. The first line segment 71-1, the second line segment 71-2 and the connection line segment 71-3 of the first power line 71 may have the same or different width. In some examples, a line width of the first line segment 71-1 is greater than a line width of each of the second line segment 71-2 and the connection line segment 71-3.

In some examples, as shown in FIG. 3 to FIG. 20, in a plane perpendicular to the display substrate, the driving circuit layer may include a shield electrode layer, a first semiconductor layer, a first conductive layer, a second conductive layer, a second semiconductor layer, a third conductive layer, a fourth conductive layer, and a fifth conductive layer sequentially arranged in a direction away from the base substrate. The shield electrode layer may include a plurality of shield electrodes 81. In the case where the shield electrode layer is coupled to the second power line or the first reference voltage line, the shield electrode layer may further include a second shield layer connection electrode 84 and a first connection line 85. The first semiconductor layer includes an active layer 11 of the third transistor T3, an active layer 12 of the fourth transistor T4, an active layer 13 of the fifth transistor T5, an active layer 14 of the sixth transistor T6, and an active layer 15 of the seventh transistor T7 in the pixel driving circuit. The first conductive layer includes a first scan line 21, a light-emitting control line 23, a first electrode 22 of the storage capacitor in the pixel driving circuit, and a first shield layer connection electrode 24. The second conductive layer includes a first gate electrode of the first transistor T1, a first gate electrode of the second transistor T2, and a second electrode 34 of the storage capacitor Cst of the pixel driving circuit, a first portion 33 of the second scan line G2, a first portion 32 of the reset signal line Re, and the first sub-signal line 31. The second semiconductor layer includes an active layer 41 of the first transistor T1 and an active layer 42 of the second transistor T2 of the pixel driving circuit. The third conductive layer includes a second gate electrode of the first transistor T1, a second gate electrode of the second transistor T2 of the pixel driving circuit, a second portion 52 of the second scan line G2, and a second portion 51 of the reset signal line Re. The fourth conductive layer includes a third sub-signal line 61 and a plurality of connection electrodes. In the case where the shield electrode layer is coupled to the second power line or the first reference voltage line, the shield electrode layer may further include a plurality of transfer electrodes 68 and a second power line 69. The fifth conductive layer includes the second sub-signal line 73 of the first initial signal line Vinit1 and the fourth sub-signal line 74 of the second initial signal line Vinit2.

It should be noted that as shown in FIG. 7, in the first conductive layer, the first electrode 22 of the storage capacitor may have a rectangular shape, and corners of the rectangular shape may be chamfered. An orthographic projection of the first electrode 22 on the base overlaps an orthographic projection of the active layer 11 of the third transistor T3 on the base substrate. In an exemplary embodiment, the first electrode 22 may serve as both one electrode of the storage capacitor Cst and the gate electrode of the third transistor T3. A region 21-1 of the first scan line 21 overlapping the active layer 12 of the fourth transistor T4 serves as a gate electrode of the fourth transistor T4. A region 23-1 of the light-emitting control line 23 overlapping the active layer 13 of the fifth transistor T5 serves as a gate electrode of the fifth transistor T5. A region of the light-emitting control line 23 overlapping the active layer 14 of the sixth transistor T6 serves as a gate electrode of the sixth transistor T6.

In the first conductive layer, with continued reference to FIG. 7, an orthographic projection of the first shield layer connection electrode 24 on the base substrate may be located between an orthographic projection of the light-emitting control line 23 on the base substrate and an orthographic projection of the first scan line 21 on the base substrate, and on a side of the orthographic projection of the light-emitting control line 23 on the base substrate away from an orthographic projection of the first electrode 22 on the base substrate. Alternatively, the plurality of first shield layer connection electrodes 24 may be disposed at different positions in the first conductive layer, which is not limited in particular.

Further, an orthographic projection of each of the first shield layer connection electrodes 24 on the base substrate overlaps both of orthographic projections of two through-holes on the base substrate, the two through-holes are respectively a first shield layer connection through-hole Va1 and a second shield layer connection through-hole Va2. The first shield layer connection through-hole Va1 penetrates through an insulation layer between the shield electrode layer and the first conductive layer, so that the shield electrode 81 in the shield electrode layer is coupled to the first shield layer connection electrode 24 via the first shield layer connection through-hole Va1. The second shield layer connection through-hole Va2 penetrates through an insulation layer between the first conductive layer and the fourth conductive layer, so that the first shield layer connection electrode 24 is coupled to the second connection electrode 63 in the fourth conductive layer via the second shield layer connection through-hole Va2. The second connection electrode 63 is coupled to the first power line 71 via a through-hole, and specifically is coupled to the second line segment 71-2 of the first power line 71 (i.e., the shield electrode 81, the first shield layer connection electrode 24, the second connection electrode 63, and the first power line 71 are sequentially coupled in a direction away from the base substrate).

Figure 16:
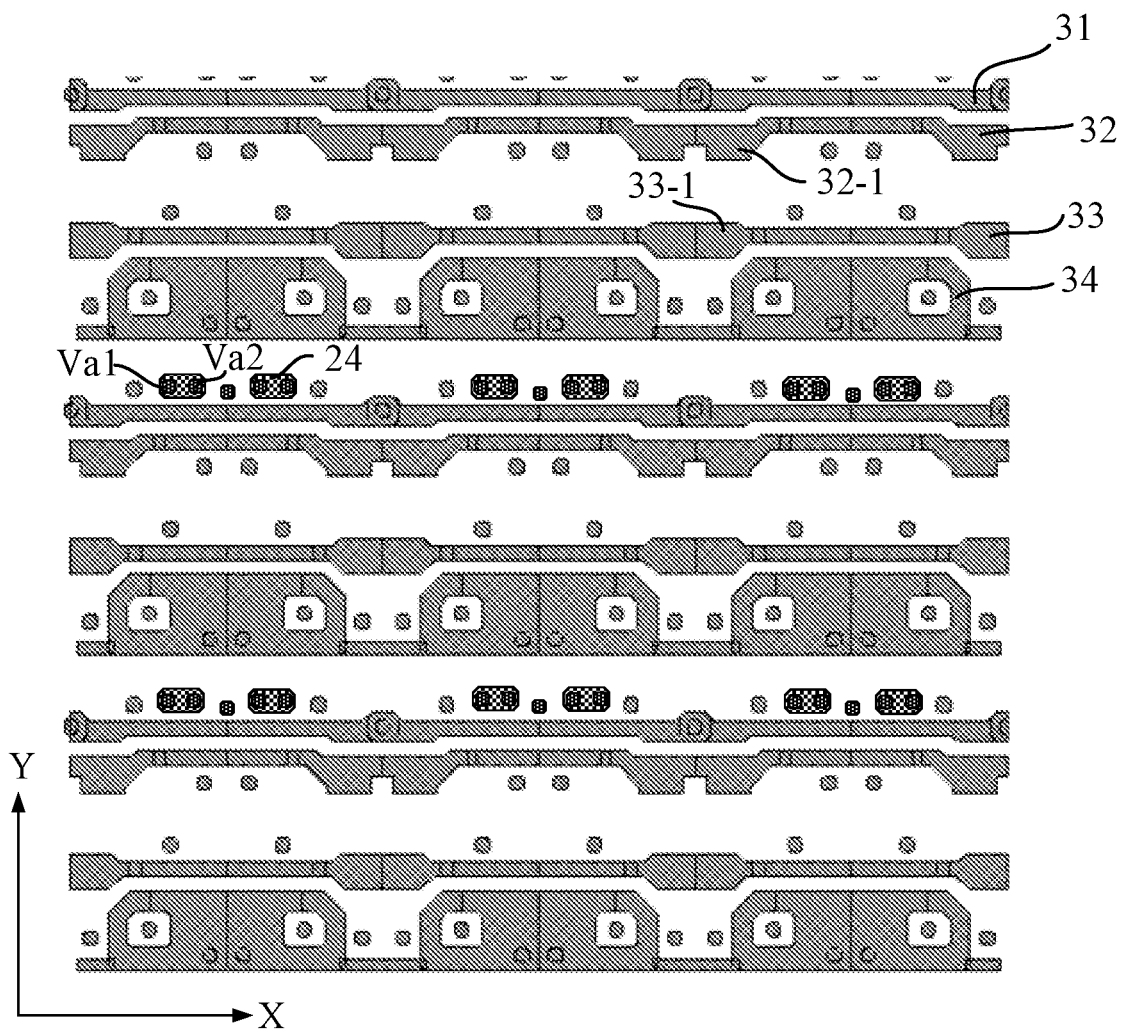
FIG. 16 is a schematic diagram showing another layout of a second conductive layer of a display substrate according to an embodiment of the present disclosure.

In some examples, referring to FIG. 7 and FIG. 16, the first shield layer connection electrode 24 may also be disposed in the second conductive layer. Similarly, in the embodiment, an orthographic projection of the first shield layer connection electrode 24 on the base substrate may be located between an orthographic projection of the light-emitting control line 23 on the base substrate and an orthographic projection of the first scan line 21 on the base substrate, and on a side of the orthographic projection of the light-emitting control line 23 on the base substrate away from the orthographic projection of the first electrode 22 on the base substrate. That is, the difference between the embodiments shown in FIG. 7 and FIG. 16 is that the first shield layer connection electrode 24 is disposed in the first conductive layer or the second conductive layer. However, the positions, in a plane of the layer structure, of the first shield layer connection electrodes 24 keep unchanged (i.e., the positions of the orthographic projections of the first shield layer connection electrodes 24 on the base substrate are unchanged).

Further, an orthographic projection of each of the first shield layer connection electrodes 24 on the base substrate overlaps orthographic projections of the two through-holes on the base substrate, the two through-holes are respectively a first shield layer connection through-hole Va1 and a second shield layer connection through-hole Va2. The first shield layer connection through-hole Va1 penetrates through an insulation layer between the shield electrode layer and the second conductive layer, so that the shield electrode 81 in the shield electrode layer is coupled to the first shield layer connection electrode 24 via the first shield layer connection through-hole Va1. The second shield layer connection through-hole Va2 penetrates through an insulation layer between the second conductive layer and the fourth conductive layer, so that the first shield layer connection electrode 24 is coupled to the second connection electrode 63 in the fourth conductive layer via the second shield layer connection through-hole Va2. The second connection electrode 63 is coupled to the first power line 71 via a through-hole, and specifically is coupled to the second line segment 71-2 of the first power line 71 (i.e., the shield electrode 81, the first shield layer connection electrode 24, the second connection electrode 63, the first power line 71 are sequentially coupled in a direction away from the base substrate). Similarly, the first shield layer connection electrode 24 may also be disposed in the third conductive layer, and other structures are the same as those in the above embodiments, which are not described herein again.

Figure 12:
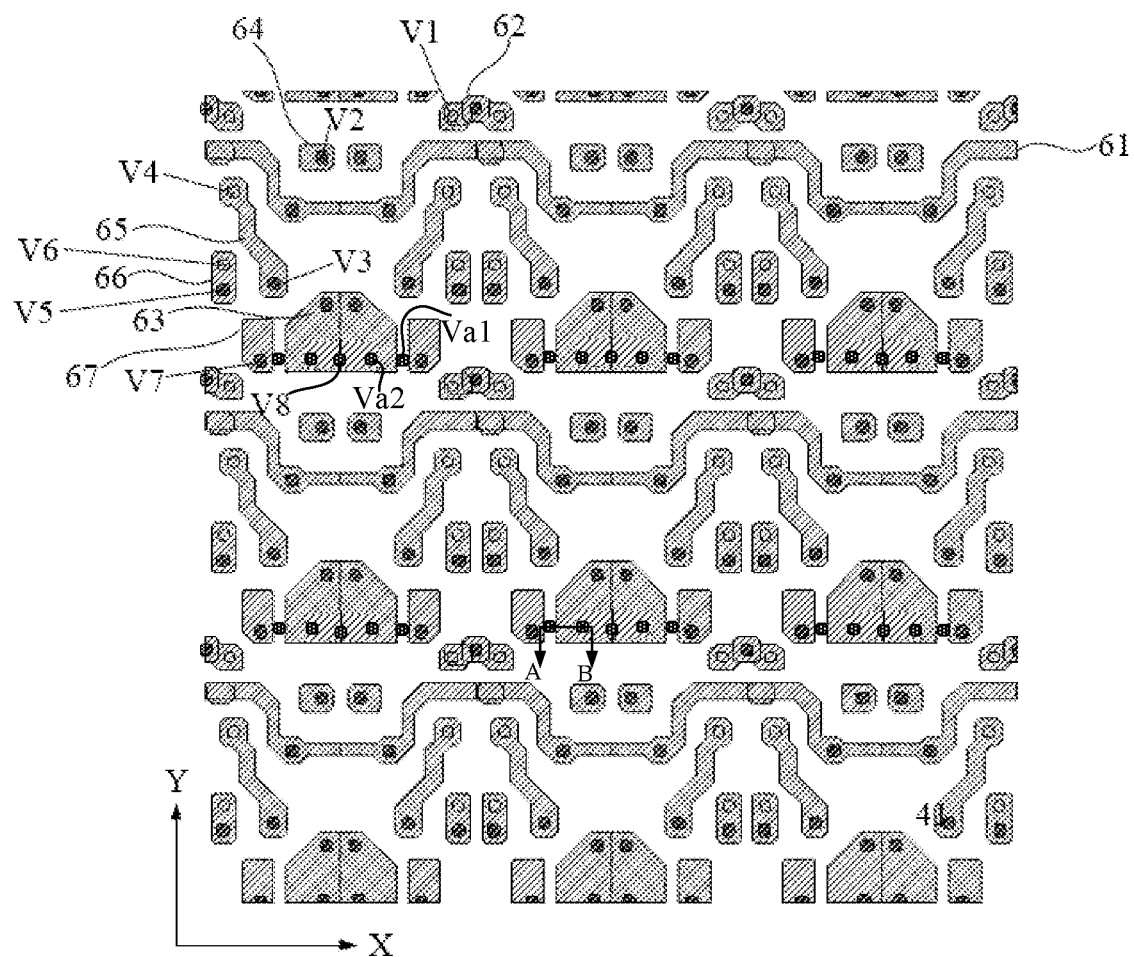
FIG. 12 is a schematic diagram showing a layout of a fourth conductive layer of a display substrate according to an embodiment of the present disclosure.
Figure 15:
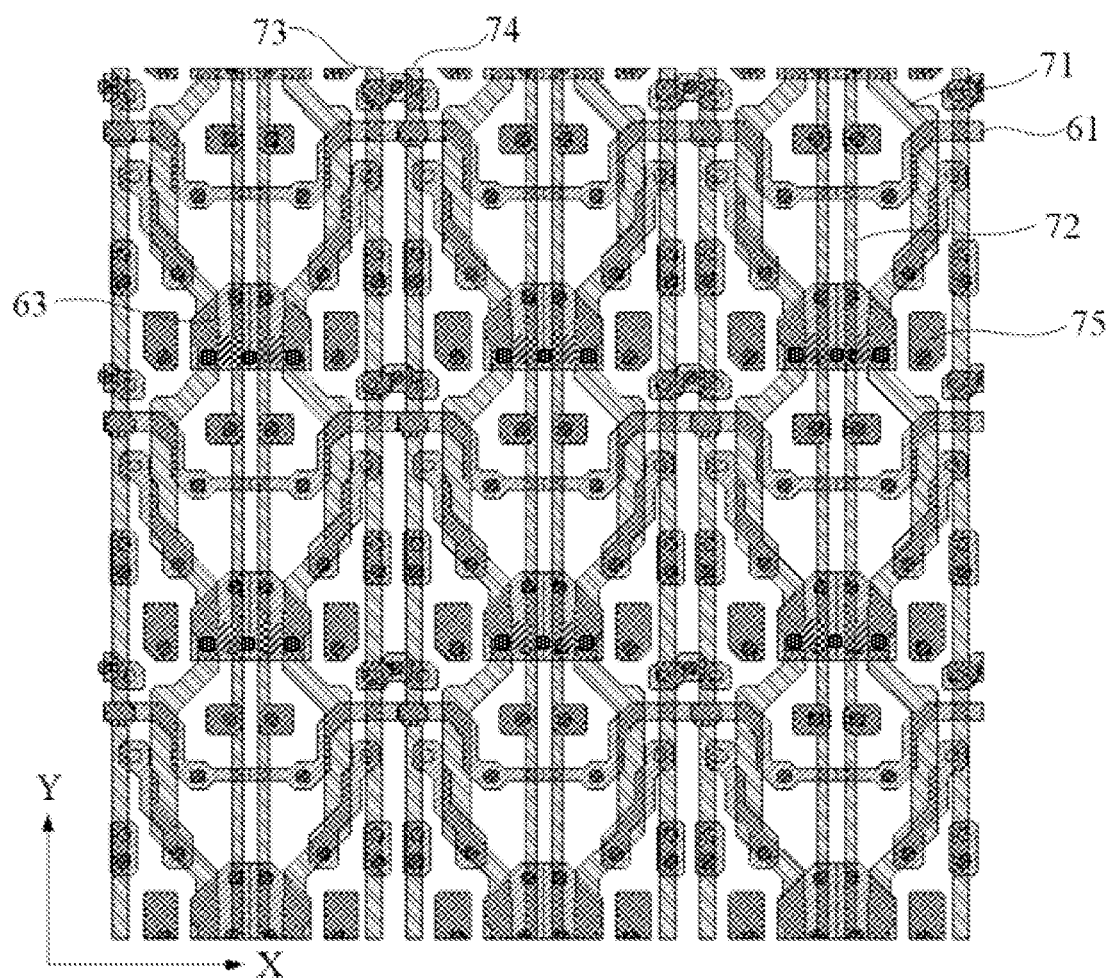
FIG. 15 is a schematic diagram showing a layout obtained after superposition of a fourth conductive layer and a fifth conductive layer of a display substrate according to an embodiment of the present disclosure

In some examples, as shown in FIG. 12, FIG. 14 and FIG. 15, the fourth conductive layer may include not only the above-described structure but also a plurality of first connection electrodes 62. The first sub-signal line 31 of the first initial signal line Vinit1 is electrically coupled to a first region (i.e., the source electrode) of the active layer 41 of the first transistor T1 via a through-hole. The first region of the active layer 41 of the first transistor T1 is electrically coupled to the first connection electrode 62 via a through-hole. The first connection electrode 62 is electrically coupled to the second sub-signal line 73 via a through-hole (i.e., the first sub-signal line 31, the first region of the active layer 41 of the first transistor, the first connection electrode 62, and the second sub-signal line 73 are coupled in sequence along a direction away from the base substrate).

In some examples, as shown in FIG. 12, FIG. 14 and FIG. 15, the fifth conductive layer includes a first power line 71, and the fourth conductive layer further includes a plurality of second connection electrodes 63 in each of the structure units 100. In the structure unit 100, one of the second connection electrodes 63 electrically couples the second line segments 71-2 of the first power lines 71 adjacent to each other in the first direction X via through-holes. As shown in FIG. 12, each of the second connection electrodes 63 includes two chamfers, so as to reserve a space for other structures. The second connection electrode 63 may have other shapes such as a circle, a regular polygon, or the like.

In some examples, as shown in FIG. 12, FIG. 14 and FIG. 15, the fifth conductive layer further includes a data line 72, and the fourth conductive layer further includes a plurality of third connection electrodes 64. In each of the circuit units, a first region (i.e., the source electrode) of the active layer 12 of the fourth transistor of the pixel driving circuit is coupled to the third connection electrode 64 via a through-hole; the third connection electrode 64 is coupled to the data line 72 via a through-hole (i.e., the first region of the active layer 12 of the fourth transistor, the third connection electrode 64, the data line 72 are coupled in sequence along a direction away from the base substrate).

In some examples, as shown in FIG. 12, the fourth conductive layer further includes a plurality of fourth connection electrodes 65. In each of the circuit units, the fourth connection electrode 65 is coupled to the gate electrode of the third transistor in the pixel driving circuit via a through-hole; a second region (i.e., the drain electrode) of the active layer 41 of the first transistor and a first region (i.e., the source electrode) of the second transistor in the pixel driving circuit are electrically coupled to the fourth connection electrode 65 via a through-hole. For example, an extension direction of the fourth connection electrode 65 has a certain included angle with the second direction Y, and the fourth connection electrode 65 has a first end and a second end that are oppositely arranged in the extension direction thereof. The first end of the fourth connection electrode 65 is coupled to the gate electrode of the third transistor via the through-hole, and the second end of the fourth connection electrode 65 is coupled to the second region of the active layer 41 of the first transistor and the first region of the second transistor via a through-hole.

Figure 11:
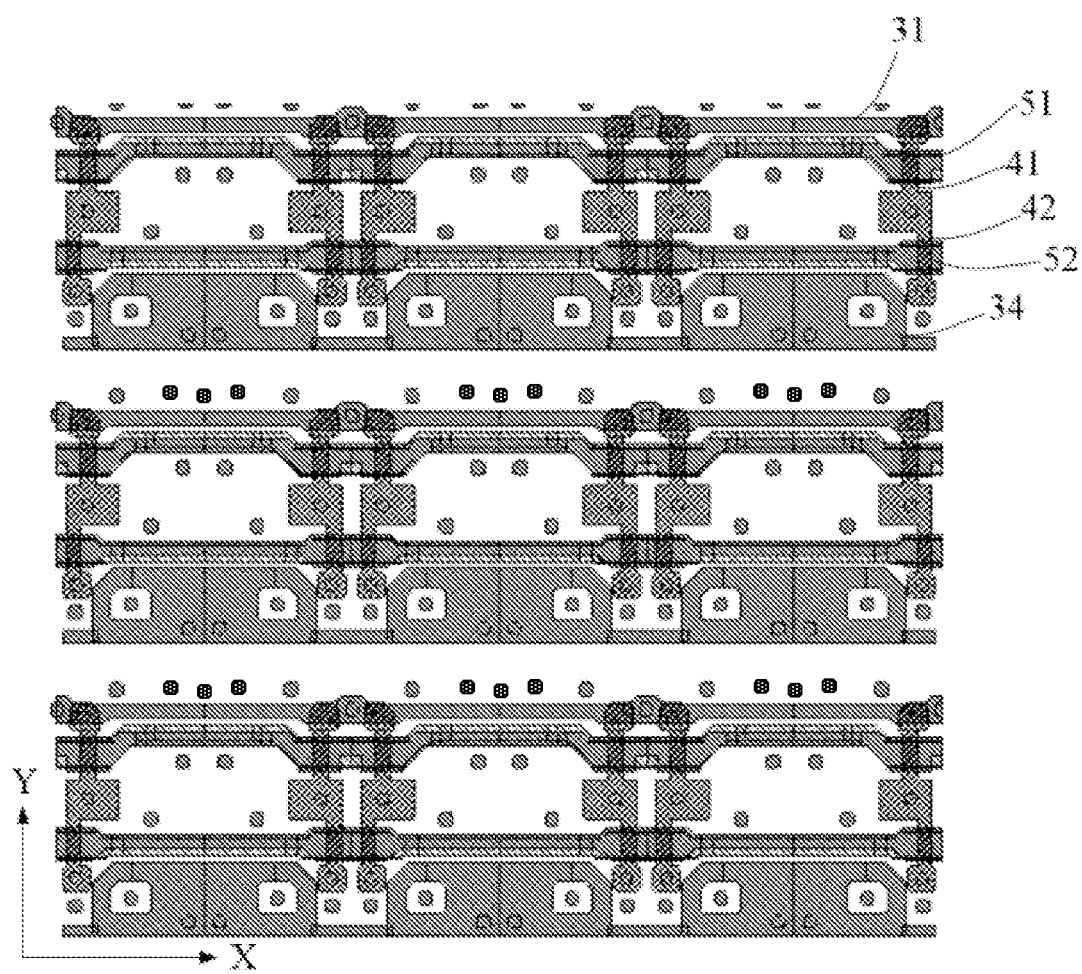
FIG. 11 is a schematic diagram showing a layout obtained after superposition of a second conductive layer, a second semiconductor layer and a third conductive layer of a display substrate according to an embodiment of the present disclosure.

In some examples, as shown in FIG. 12, the fourth conductive layer further includes a plurality of fifth connection electrodes 66. In each of the circuit units, the fifth connection electrodes 66 are electrically coupled to a second region (i.e., the drain electrode) of the active layer of the third transistor in the pixel driving circuit via a through-hole, and a second region (i.e., the drain electrode) of the active layer 42 of the second transistor in the pixel driving circuit is electrically coupled to the fifth connection electrodes 66 via a through-hole. In some examples, as shown in FIG. 11 to FIG. 13, the fourth conductive layer further includes a sixth connection electrode 67, and the fifth conductive layer further includes a seventh connection electrode 75. In each of the circuit units, the sixth connection electrode 67 is electrically coupled to a second region (i.e., the drain electrode) of the active layer 14 of the sixth transistor via a through-hole; the sixth connection electrode 67 is electrically coupled to the seventh connection electrode 75 via a through-hole. An anode of the light-emitting device is electrically coupled to the seventh connection electrode 75 via a through-hole (i.e., the second region of the active layer 14 of the sixth transistor, the sixth connection electrode 67, the seventh connection electrode 75, and the anode of the light-emitting device are coupled in sequence along a direction away from the base substrate).

It should be noted that, in the circuit layout shown in FIG. 6 to FIG. 18, similarly to FIG. 7, the O structure represents that a through-hole for implementing electrical connection between different conductive layers is provided at this position, and the O structure is not necessarily provided in the same layer as the conductive structures in the corresponding layer.

In some examples, the driving circuit layer may further include a first insulation layer, a second insulation layer, a third insulation layer, a fourth insulation layer, a fifth insulation layer, a sixth insulation layer, and a seventh insulation layer. The first insulation layer is disposed between the base substrate and the shield electrode layer, the second insulation layer is disposed between the first semiconductor layer and the first conductive layer, the third insulation layer is disposed between the first conductive layer and the second conductive layer, the fourth insulation layer is disposed between the second conductive layer and the second semiconductor layer, the fifth insulation layer is disposed between the second semiconductor layer and the third conductive layer, the sixth insulation layer is disposed between the fourth conductive layer and the third conductive layer, and the seventh insulation layer is disposed between the fourth conductive layer and the fifth conductive layer. A process for manufacturing a display substrate will be illustrated below. A "patterning process" in the present disclosure includes processes of coating a photoresist, mask exposing, developing, etching, and stripping a photoresist performed on a metal material, an inorganic material, or a transparent conductive material, and further includes processes of coating an organic material, mask exposing, and developing performed on an organic material. The deposition may include any one or more of sputtering, evaporation, and chemical vapor deposition processes. The coating may include any one or more of spray coating, spin coating, and inkjet printing. The etching may include any one or more of dry etching and wet etching, which is not limited in the present disclosure. "A thin film" refers to a layer formed by depositing, coating or the like a material on a base substrate. The "thin film" may also be referred to as a "layer", if a patterning process is not necessarily performed on the thin film during the entire fabrication process. If a patterning process is necessarily performed on the thin film during the entire fabrication process, the "thin film" before the patterning process is referred to as the "thin film", and the "thin film" after the patterning process is referred to as the "layer". The "layer" after the patterning process includes at least one "pattern". "A and B are disposed on the same layer" in the present disclosure means that A and B are formed simultaneously by the same patterning process, and a "thickness" of the film layer is a dimension of the film layer in a direction perpendicular to the display substrate. In the exemplary embodiments of the present disclosure, "an orthographic projection of B is located within a range of an orthographic projection of A" or "an orthographic projection of A includes an orthographic projection of B" means that a boundary of the orthographic projection of B falls within a range of a boundary of the orthographic projection of A, or the boundary of the orthographic projection of A overlaps the boundary of the orthographic projection of B.

The process for manufacturing the driving circuit layer in an embodiment of the present disclosure may include step 1 to step 10.

At step 1, a shield electrode layer pattern is formed. In some examples, the formation of the shield electrode layer pattern may include depositing a material film of the shield electrode 81 on the base substrate, and patterning the material film of the shield electrode 81 through a patterning process to form the shield electrode layer, as shown in FIG. 5.

In some examples, the plurality of shield electrodes 81 of the shield electrode layer may be a block structure, for example, a square block, a circular block, a regular polygonal block, or the like. The shape of the shield electrode 81 is not limited in the embodiment of the present disclosure, as long as an orthographic projection of the shield electrode 81 on the base substrate covers or overlaps an orthographic projection, on the base substrate, of the active layer 11 of the third transistor in the pixel driving circuit to be formed later.

When the shield electrode layer is coupled to the second power line or the first reference voltage line in the frame region Sc, the formation of the shield electrode layer pattern may include: depositing material films of the shield electrode 81, the second shield layer connection electrode 84, the first connection line 85, and the connection electrode bar 83 on the base substrate, and patterning the shield electrode 81, the second shield layer connection electrode 84, the first connection line 85, and the connection electrode bar 83 through a patterning process to form the shield electrode layer, as shown in FIG. 17.

At step 2, a first semiconductor pattern is formed. In some examples, the formation of the first semiconductor pattern may include: sequentially depositing a first insulation film and a first semiconductor film on the base substrate with the pattern formed thereon; and patterning the first semiconductor film through a patterning process to form a first insulation layer covering the base substrate and a first semiconductor layer disposed on the first insulation layer, as shown in FIG. 6.

In some examples, the first semiconductor layer of each of the circuit units may include the active layer 11 of the third transistor to the active layer 15 of the seventh transistor, which have a one-piece structure.

In some examples, the active layer 12 of the fourth transistor in the $M^{th}$ row of circuit units is located on a side of the active layer 11 of the third transistor of the $M^{th}$ row of circuit units away from the $(M+1)^{th}$ row of circuit units. The active layer 13 of the fifth transistor, the active layer 14 of the sixth transistor, and the active layer 15 of the seventh transistor in the $M^{th}$ row of circuit units are located on a side of the active layer 11 of the third transistor of in the $M^{th}$ row of circuit units proximal to the $(M+1)^{th}$ row of circuit units. The active layer 15 of the seventh transistor is located on a side of the active layer 13 of the fifth transistor and the active layer 14 of the sixth transistor away from the active layer 11 of the third transistor.

In some examples, the active layer 11 of the third transistor may have a "Ω" shape. The active layer 12 of the fourth transistor and the active layer 13 of the fifth transistor may have a shape of the Arabic numeral "1". The active layer 14 of the sixth transistor may have an "L" shape. The active layer 15 of the seventh transistor may have a shape of the Arabic numeral "7".

In some examples, the active layer of each of the transistors may include a first region, a second region, and a channel region between the first region and the second region. The first region of the active layer 11 of the third transistor serves as both of the second region of the active layer 12 of the fourth transistor and the second region of the active layer 13 of the fifth transistor. The second region of the active layer 11 of the third transistor serves as the first region of the active layer 14 of the sixth transistor. The second region of the active layer 14 of the sixth transistor serves as the second region of the active layer 15 of the seventh transistor. In some embodiments, the first region of the active layer 12 of the fourth transistor and the first region of the active layer 13 of the fifth transistor are separately provided.

At step 3, a first conductive layer pattern is formed. In some examples, the formation of the first conductive layer pattern may include: depositing a second insulation film and a first conductive film in sequence on the base substrate with the patterns described formed thereon; and patterning the first conductive film through a patterning process to form a second insulation layer covering the semiconductor patterns and a first conductive layer pattern on the second insulation layer. The first conductive layer pattern at least includes: the first scan line 21, the light-emitting control line 23, the first electrode 22 of the storage capacitor, and the first shield layer connection electrode 24, as shown in FIG. 7.

The first scan line 21 and the light-emitting control line 23 both extend in the first direction X. The first scan line 21 for the $M^{th}$ row of circuit units is located on a side of the first electrode 22 of the storage capacitor of the $M^{th}$ row of circuit units away from the $(M+1)^{th}$ row of circuit units. The light-emitting control line 23 may be located on a side of the first electrode 22 of the $M^{th}$ row of circuit units proximal to the $(M+1)^{th}$ row of circuit units.

In some examples, the first electrode 22 of the storage capacitor may have a rectangular shape, corners of the rectangular shape may be chamfered. An orthographic projection of the first electrode 22 on the base substrate overlaps an orthographic projection of the active layer 11 of the third transistor on the base substrate. In an exemplary embodiment, the first electrode 22 may serve as both of one electrode of the storage capacitor and an electrode of the third transistor. A region 21-1 where the first scan line 21 overlaps the active layer 12 of the fourth transistor serves as a gate electrode of the fourth transistor. A region 23-1 where the light-emitting control line 23 overlaps the active layer 13 of the fifth transistor serves as the gate electrode of the fifth transistor. A region where the light-emitting control line 23 overlaps the active layer 14 of the sixth transistor serves as the gate electrode of the sixth transistor.

At step 4, a second conductive layer pattern is formed. In some examples, the formation of the second conductive layer pattern may include: depositing a third insulation film and a second conductive film in sequence on the base substrate with the patterns described formed thereon; and patterning the second conductive film through a patterning process to form a third insulation layer covering the first conductive layer and a second conductive layer pattern on the third insulation layer. The second conductive layer pattern at least includes: the first sub-signal line 31 of the first initial signal line Vinit1, the first portion 32 of the reset signal line, the first portion 33 of the second scan line, the second electrode 34 of the storage capacitor, and the electrode connection line, as shown in FIG. 8. In some examples, the formation of the second conductive layer pattern may further include forming the pattern of the first shield layer connection electrode 24.

The first sub-signal line 31, the first portion 32 of the reset signal line, and the first portion 33 of the second scan line extend along the first direction X. The first sub-signal line 31, the first portion 33 of the second scan line, and the first portion 32 of the reset signal line in the $M^{th}$ row of circuit units are all located on a side of the second electrode 34 of the storage capacitor in the $M^{th}$ row of circuit units away from the $(M+1)^{th}$ row of circuit units. The first sub-signal line 31 and the first portion 32 of the reset signal line in the M-th row of circuit units are all located on a side of the first portion 33 of the second scan line in the $M^{th}$ row of circuit units away from the second electrode 34 of the storage capacitor, and the reset signal line is located between the first sub-signal line 31 and the first portion 33 of the second scan line.

In some examples, a profile of the second electrode 34 may have a rectangular shape, corners of the rectangular shape may be chamfered. An orthographic projection of the second electrode 34 on the base substrate may overlap an orthographic projection of the first electrode 22 on the base substrate. The first electrode 22 and the second electrode 34 form the storage capacitor of the pixel driving circuit. The second electrode 34 has an opening 34-1 formed therein, and the opening 34-1 may be located in the middle of the second electrode 34. The openings may be rectangular, so that the second electrode 34 has a ring-shaped structure. The opening 34-1 exposes the third insulation layer covering the first electrode 22, and an orthographic projection of the first electrode 22 on the base substrate includes an orthographic projection of the opening on the base substrate. In an exemplary embodiment, the opening is configured to receive a first through-hole V1 to be formed subsequently. The first through-hole V1 is located within the opening and exposes the first electrode 22, so that the second electrode of the first transistor to be formed subsequently is coupled to the first electrode 22.

In some examples, the electrode connection line is disposed between the second electrodes 34 of the adjacent circuit units in the first direction X or in a direction opposite to the first direction X. A first end of the electrode connection line is coupled to the second electrode 34 of one of the adjacent circuit units, and a second end of the electrode connection line extends in the first direction X or in the direction opposite to the first direction X and is coupled to the second electrode 34 of the other of the adjacent circuit units. That is, the electrode connection line connects the second electrodes 34 of the adjacent circuit units to each other in one row unit 10. In some examples, the second electrodes 34 of multiple circuit units in one row unit 10 may form a one-piece structure coupled to each other through the electrode connection lines. The second electrodes 34 of the one-piece structure may serve as power signal lines, so as to ensure that the multiple second electrodes 34 in one row unit 10 have the same potential, thereby improving uniformity of a panel, avoiding poor display of a display substrate, and ensuring display effect of the display substrate.

In some examples, each of the first transistor and the second transistor in the pixel driving circuit adopts a dual-gate structure. A region where the first portion 32 of the reset signal line overlaps the active layer 41 of the first transistor to be formed serves as the first gate electrode of the first transistor. For example, the first portion 32 of the reset signal line is provided with a gate block 32-1 protruding toward the second scanning signal line, and the gate block 32-1 serves as the first gate electrode of the first transistor. A region where the first portion 33 of the second scan line overlaps the active layer 42 of the second transistor to be formed serves as a first gate electrode of the second transistor. For example, a plurality of protruding gate blocks 33-1 are disposed on the first portion 33 of the second scan line, each protruding gate block 33-1 serves as the first gate electrode of the second transistor.

Figure 9:
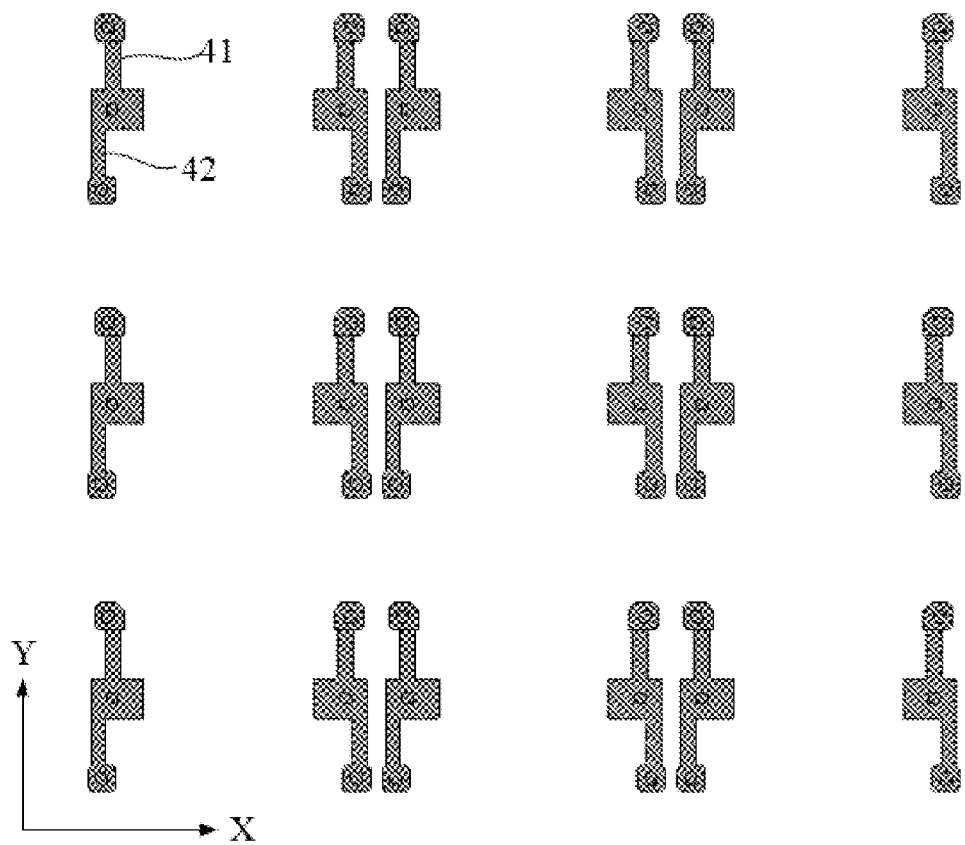
FIG. 9 is a schematic diagram showing a layout of a second semiconductor layer of a display substrate according to an embodiment of the present disclosure.

At step 5, a second semiconductor layer pattern is formed. In some examples, the formation of the second semiconductor layer pattern includes: depositing a fourth insulation layer film and a second semiconductor film on the base substrate on which the aforementioned patterns are formed; patterning the first semiconductor film through a patterning process to form a fourth insulation layer covering the second conductive layer and a second semiconductor layer on the fourth insulation layer, as shown in FIG. 9.

In some examples, the active layer 41 of the first transistor and the active layer 42 of the second transistor in the $M^{th}$ row of circuit units are located on a side of the active layer 11 of the third transistor in the $M^{th}$ row of circuit units away from the $(M+1)^{th}$ row of circuit units.

In some examples, the second semiconductor layer of each of the circuit units includes the active layer 41 of the first transistor and the active layer 42 of the second transistor. In some examples, the second region of the first transistor serves as the first region of the second transistor.

In some examples, each of the active layer 41 of the first transistor and the active layer 42 of the second transistor may have a shape of "1".

Figure 10:
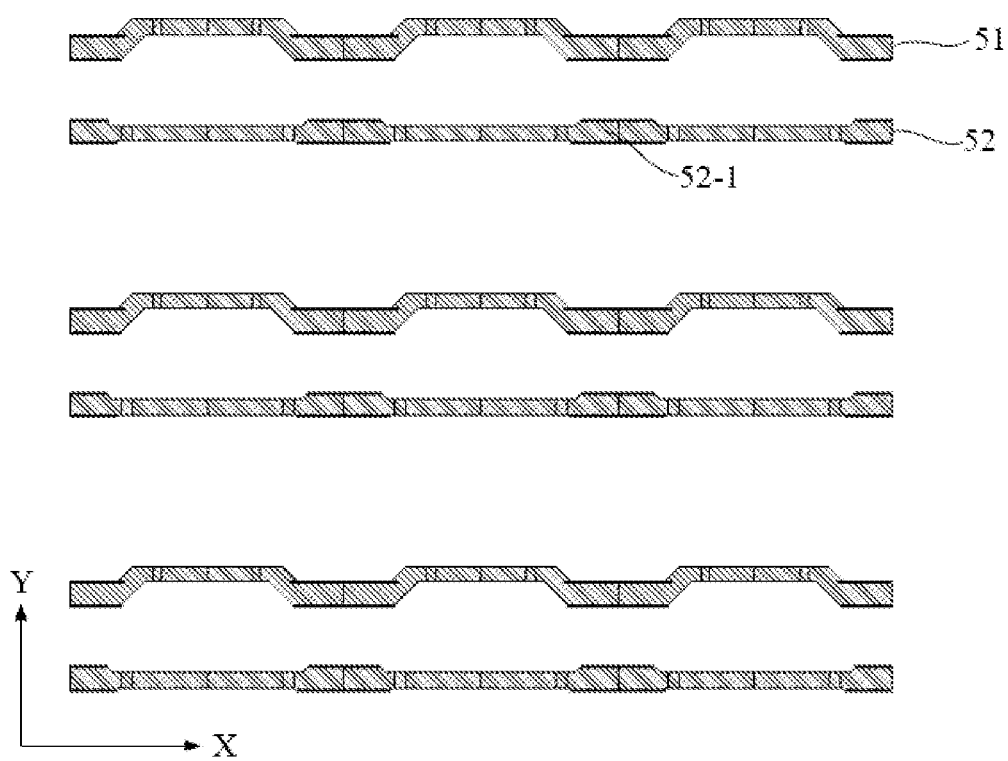
FIG. 10 is a schematic diagram showing a layout of a third conductive layer of a display substrate according to an embodiment of the present disclosure.

At step 6, a third conductive layer pattern is formed. In some examples, the formation of the third conductive layer pattern may include: depositing a fifth insulation film and a third conductive film in sequence on the base substrate with the patterns described formed thereon; patterning the third conductive film through a patterning process to form a fifth insulation layer covering the second semiconductor layer and the third conductive layer pattern on the fifth insulation layer. The second conductive layer pattern at least includes: a second portion 51 of the reset signal line and a second portion 52 of the second scan line, as shown in FIG. 10. In some examples, the formation of the third conductive layer pattern further includes forming a pattern of the first shield layer connection electrode 24.

The second portion 51 of the reset signal line and the second portion 52 of the second scan line extend in the first direction X, and the second portion 51 of the reset signal line has the same pattern as, or substantially the same pattern as, the first portion 32 of the reset signal line. Further, an orthographic projection of the second portion 51 of the reset signal line on the base substrate substantially overlaps an orthographic projection, on the base substrate, of the first portion 32 of the reset signal line disposed facing the second portion 51 of the reset signal line. An orthographic projection of the second portion 52 of the second scan line on the base substrate substantially overlaps an orthographic projection, on the base substrate, of the first portion 33 of the second scan line facing the second portion 52 of the second scan line.

In some examples, a region of the second portion 51 of the reset signal line overlapping the active layer 41 of the first transistor serves as a second gate electrode of the first transistor, i.e., a dual-gate structure of the first transistor is formed. A region of the second portion 52 of the second scan line overlapping the active layer 42 of the second transistor serves as a second gate electrode of the second transistor, i.e., a dual-gate structure of the second transistor is formed.

At step 7, a sixth insulation layer pattern is formed. In some examples, the formation of the sixth insulation layer pattern may include: depositing a sixth insulation film on the base substrate on which the above patterns are formed; and patterning the sixth insulation film through a patterning process to form a sixth insulation layer covering the second conductive layer. A plurality of through-holes are formed in each of the circuit units, and the plurality of through-holes at least include: a first through-hole V1, a second through-hole V2, a third through-hole V3, a fourth through-hole V4, a fifth through-hole V5, a sixth through-hole V6, a seventh through-hole V7, an eighth through-hole V8, a first shield layer connection through-hole Va1, and a second shield layer connection through-hole Va2.

As shown in FIG. 12, an orthographic projection of the first through-hole V1 on the base substrate is within a range of an orthographic projection of the first region of the active layer 41 of the first transistor on the base substrate. The fifth insulation layer and the sixth insulation layer in the first through-hole V1 are etched away to expose the first region of the active layer 41 of the first transistor. The first through-hole V1 is configured to electrically couple the subsequently formed first connection electrode 62 to the first region of the first transistor.

In some examples, an orthographic projection of the second through-hole V2 on the base substrate is within a range of an orthographic projection of the first region of the active layer 12 of the fourth transistor on the base substrate. The second insulation layer, the third insulation layer, the fourth insulation layer, the fifth insulation layer and the sixth insulation layer within the second through-hole V2 are etched away to expose the first region of the active layer 12 of the fourth transistor. The second through-hole V2 is configured to electrically couple the subsequently formed third connection electrode 64 to the first region of the active layer 12 of the fourth transistor.

In some examples, the third through-hole V3 is located within the opening of the second electrode 34, and an orthographic projection of the third through-hole V3 on the base substrate is within a range of an orthographic projection of the gate electrode of the third transistor on the base substrate. The third insulation layer, the fourth insulation layer, the fifth insulation layer, and the sixth insulation layer in the third through-hole V3 are etched away to expose a surface of the first electrode 22 of the storage capacitor. The third through-hole V3 is configured to connect the subsequently formed fourth connection electrode 65 to the first electrode 22 of the storage capacitor.

An orthographic projection of the fourth through-hole V4 on the base substrate is within a range of orthographic projections of the second region of the active layer 41 of the first transistor and the first region of the second transistor on the base substrate. The fifth and sixth insulation layers within the fourth through-hole V4 are etched away to expose the second region of the active layer 41 of the first transistor and the first region of the second transistor. The fourth through-hole V4 is configured to electrically couple the subsequently formed fourth connection electrode 65 to both of the second region of the active layer 41 of the first transistor and the first region of the second transistor, so that the first electrode 22 of the storage capacitor (i.e., the gate electrode of the third transistor) in the pixel driving circuit is electrically coupled to the drain electrode of the first transistor and to the source electrode of the second transistor via the fourth connection electrode 65.

In some examples, an orthographic projection of the fifth through-hole V5 on the base substrate is within a range of an orthographic projection of the second region of the active layer 11 of the third transistor on the base substrate. The second insulation layer, the third insulation layer, the fourth insulation layer, the fifth insulation layer and the sixth insulation layer within the fifth through-hole V5 are etched away to expose the second region of the active layer 11 of the third transistor. The fifth through-hole V5 is configured to electrically couple the subsequently formed fifth connection electrode 66 to the second region of the third transistor.

An orthographic projection of the sixth through-hole V6 on the base substrate is located within a range of an orthographic projection of the second region of the active layer 42 of the second transistor on the base substrate. The fifth insulation layer and the sixth insulation layer in the sixth through-hole V6 are etched away to expose the second region of the second transistor. The sixth through-hole V6 is configured to electrically couple the subsequently formed fifth connection electrode 66 to the second region of the active layer 42 of the second transistor, so that the drain electrode of the third transistor and the drain electrode of the second transistor are electrically coupled to each other via the fifth connection electrode 66.

In some examples, an orthographic projection of the seventh through-hole V7 on the base substrate is within a range of an orthographic projection of the second region of the active layer 14 of the sixth transistor on the base substrate. The second insulation layer, the third insulation layer, the fourth insulation layer, the fifth insulation layer and the sixth insulation layer within the seventh through-hole V7 are etched away to expose the second region of the active layer 14 of the sixth transistor. The seventh through-hole V7 is configured to electrically couple the subsequently formed sixth connection electrode 67 to the second region of the active layer 14 of the sixth transistor.

In some examples, an orthographic projection of the eighth through-hole V8 on the base substrate is within a range of an orthographic projection of the second electrode 34 of the storage capacitor on the base substrate. The fourth insulation layer, the fifth insulation layer and the sixth insulation layer in the eighth through-hole V8 are etched away to expose a surface of the second electrode 34 of the storage capacitor. The eighth through-hole V8 is configured to electrically couple the subsequently formed second connection electrode 63 to the second electrode 34 of the storage capacitor.

At step 7, a fourth conductive layer pattern is formed. In some examples, the formation of the fourth conductive layer pattern may include: depositing a fourth conductive film on the base substrate with above patterns formed thereon; and patterning the fourth conductive film through a patterning process to form the fourth conductive layer pattern on the sixth insulation layer. The fourth conductive layer includes at least: a first connection electrode 62, a second connection electrode 63, a third connection electrode 64, a fourth connection electrode 65, a fifth connection electrode 66, a sixth connection electrode 67, and a third sub-signal line 61 of a second initial signal line Vinit2, as shown in FIG. 12.

In some examples, an extension direction of the third sub-signal line 61 of the second initial signal line Vinit2 is the first direction X. The third sub-signal line 61 in the $M^{th}$ row of circuit units is located on a side of the first sub-signal line 31 in the $M^{th}$ row of circuit units proximal to the $(M+1)^{th}$ row of circuit units.

In some examples, the first connection electrode 62 in the $N^{th}$ circuit unit in the $M^{th}$ row and the first connection electrode 62 in the $(N+1)^{th}$ circuit unit in the $M^{th}$ row are coupled together to form a one-piece structure. The first connection electrode 62 covers the first connection through-hole, and is configured to electrically couple the first sub-signal line 31 of the first initial signal line Vinit1 to the subsequently formed second sub-signal line 73.

In some examples, the second connection electrode 63 is a block structure and configured to short the subsequently formed first power line 71 to reduce resistance. The second connection electrodes 63 in every two adjacent circuit units in the first direction X are coupled to each other to form a one-piece structure. The second connection electrode 63 covers the eighth through-hole V8 and couples the second electrode 34 of the storage capacitor to the first power line 71 to be formed subsequently.

In some examples, the third connection electrode 64 may be a pad structure, and each of the third connection electrodes 64 covers a corresponding second through-hole V2. That is, the third connection electrodes 64 are in one-to-one correspondence with the second through-holes V2. The third connection electrode 64 is configured to electrically couple the first region (i.e., the source electrode) of the active layer 12 of the fourth transistor to the subsequently formed data line 72.

In some examples, the fourth connection electrode 65 covers the third and fourth through-holes V3 and V4 and is configured to electrically couple the first electrode 22 of the storage capacitor in the pixel driving circuit (i.e., the gate electrode of the third transistor) to the second region (i.e., the drain electrode) of the active layer 41 of the first transistor and with the first region (i.e., the source electrode) of the active layer 42 of the second transistor via the third and fourth through-holes V3 and V4.

In some examples, the fifth connection electrode 66 covers the fifth through-hole V5 and the sixth through-hole V6 and is configured to electrically couple the second region (i.e., the drain electrode) of the active layer 11 of the third transistor in the pixel driving circuit to the second region (i.e., the drain electrode) of the active layer 42 of the second transistor via the fifth through-hole V5 and the sixth through-hole V6.

In some examples, the sixth connection electrode 67 covers the seventh through-hole V7 and is configured to electrically couple the second region (i.e., the drain electrode) of the active layer 14 of the sixth transistor to the anode of the subsequently formed light-emitting device via the seventh through-hole V7.

At step 8, a seventh insulation layer pattern is formed. In some examples, the formation of the seventh insulation layer pattern may include: depositing a seventh insulation film on the base substrate on which the patterns are formed; patterning the seventh insulation film through a patterning process to form a seventh insulation layer covering the third conductive layer. A plurality of through-holes in each of the circuit units further include: a ninth through-hole V9, a tenth through-hole V10, an eleventh through-hole V11, a twelfth through-hole V12, and a thirteenth through-hole V14.

As shown as FIG. 14 and FIG. 15, an orthographic projection of the ninth through-hole V9 on the base substrate is within a range of an orthographic projection of the first connection electrode 62 on the base substrate. The seventh insulation layer in the ninth through-hole V9 is etched away to expose the first connection electrode 62. The ninth through-hole V9 is configured to electrically couple the second sub-signal line 73 of the first initial signal line Vinit1 to be formed subsequently to the first connection electrode 62, so that the first sub-signal line 31 of the first initial signal line Vinit1 is electrically coupled to the second sub-signal line 73.

In some examples, an orthographic projection of the tenth through-hole V10 on the base substrate is within a range of an orthographic projection of the third sub-signal line 61 of the second initial signal line Vinit2 on the base substrate. The seventh insulation layer within the tenth through-hole V10 is etched away to expose the third sub-signal line 61 of the second initial signal line Vinit2. The tenth through-hole V10 is configured to electrically couple the fourth sub-signal line 74 of the second initial signal line Vinit2 to be formed subsequently to the first connection electrode 62, so that the third sub-signal line 61 of the second initial signal line Vinit2 is electrically coupled to the fourth sub-signal line.

In some examples, an orthographic projection of the eleventh through-hole V11 on the base substrate covers or overlaps a range of an orthographic projection of the second connection electrode 63 on the base substrate. The seventh insulation layer in the eleventh through-hole V11 is etched away to expose the second connection electrode 63. The eleventh through-hole V11 is configured to electrically couple the first power line 71 to be formed later to the second connection electrode 63 to form a conductive mesh structure, so that the first power line 71 is electrically coupled to the second electrode 34 of the storage capacitor.

In some examples, an orthographic projection of the twelfth through-hole V12 on the base substrate covers or overlaps a range of an orthographic projection of the third connection electrode 64 on the base substrate. The seventh insulation layer in the twelfth through-hole V12 is etched away to expose the third connection electrode 64. The twelfth through-hole V12 is configured to electrically couple the subsequently formed data line 72 to the third connection electrode 64, so that the first region (i.e., the source electrode) of the active layer 12 of the fourth transistor is electrically coupled to the data line 72.

In some examples, an orthographic projection of the thirteenth through-hole V14 on the base substrate covers or overlaps a range of an orthographic projection of the sixth connection electrode 67 on the base substrate. The seventh insulation layer in the thirteenth through-hole V14 is etched away to expose the sixth connection electrode 67. The thirteenth through-hole V14 is configured to electrically couple the seventh connection electrode 75 to be formed subsequently to the sixth connection electrode, so that the anode of the light-emitting device to be formed subsequently is electrically coupled to the second region (i.e., the drain electrode) of the active layer 14 of the sixth transistor.

At step 9, the fifth conductive layer pattern is formed. In some examples, the formation of the fifth conductive layer pattern may include: depositing a fifth conductive film on the base substrate with above patterns formed thereon; and patterning the fifth conductive film through a patterning process to form the fifth conductive layer pattern on the seventh insulation layer. The fifth conductive layer pattern includes at least: a first power line 71, a second sub-signal line 73 of the first initial signal line Vinit2, a fourth sub-signal line 74 of the second initial signal line Vinit2, the data line 72, and a seventh connection electrode 75, as shown in FIG. 14 and FIG. 15.

In some examples, the first power line 71, the second sub-signal line 73 of the first initial signal line Vinit1, the fourth sub-signal line 74 of the second initial signal line Vinit2, and the data line 72 all extend in the second direction Y. The first power line 71, the second sub-signal line 73 of the first initial signal line Vinit1, the fourth sub-signal line 74 of the second initial signal line Vinit2, and the data line 72 may be straight lines or bent lines. In FIG. 12, an embodiment in which the second sub-signal line 73 of the first initial signal line Vinit1, the fourth sub-signal line 74 of the second initial signal line Vinit2, and the data line 72 are straight lines, and the first power line 71 is a bent line is illustrated as an example. In some examples, the first power line 71 in the circuit unit includes a first line segment 71-1 and a second line segment 71-2 both extending in the second direction Y and electrically coupled to each other. In the column unit 20, the first line segment 71-1 of the first power line 71 of one of adjacent circuit units is electrically coupled to the second line segment 71-2 of the other of the adjacent circuit units. In the structure unit 100, a distance between the second line segments 71-2 adjacent to each other in the first direction X is smaller than a distance between the first line segments 71-1 adjacent to each other in the first direction X. In each of the structure units 100, the second line segments 71-2 adjacent to each other in the first direction X are shorted, and in this case, the first power lines 71 form a conductive mesh structure, whereby the resistance can be reduced.

In some examples, the second sub-signal line 73 of the first initial signal line Vinit1 is coupled to the first connection electrode 62 via the ninth through-hole V9, so that the first sub-signal line 31 of the first initial signal line Vinit1 is electrically coupled to the second sub-signal line 73.

In some examples, the fourth sub-signal line 74 of the second initial signal line Vinit2 is electrically coupled to the third sub-signal line 61 via the tenth through-hole V10.

In some examples, the first power line 71 is coupled to the second connection electrode 63 via an eleventh through-hole V11, so that both of the second electrode 34 of the storage capacitor and the shield electrode layer (i.e., the first shield layer connection electrode 24) are electrically coupled to the first power line 71.

In some examples, the data line 72 is coupled to the third connection electrode 64 via the twelfth through-hole V12, so that the data line 72 is electrically coupled to the first region of the active layer 12 of the fourth transistor.

In some examples, the seventh connection electrode 75 is electrically coupled to the sixth connection electrode 67 via the thirteenth through-hole V143, so that the drain electrode of the sixth transistor is electrically coupled to the anode of the subsequently formed light-emitting device.

At step 10, a first planarization layer pattern is formed. In some examples, the formation of the first planarization layer pattern may include: coating a first planarization film on the base substrate with above patterns formed thereon; and patterning the first planarization film through a patterning process to form the first planarization layer covering the fifth conductive layer. The fourteenth through-hole V14 is formed in the first planarization layer.

Figure 20:
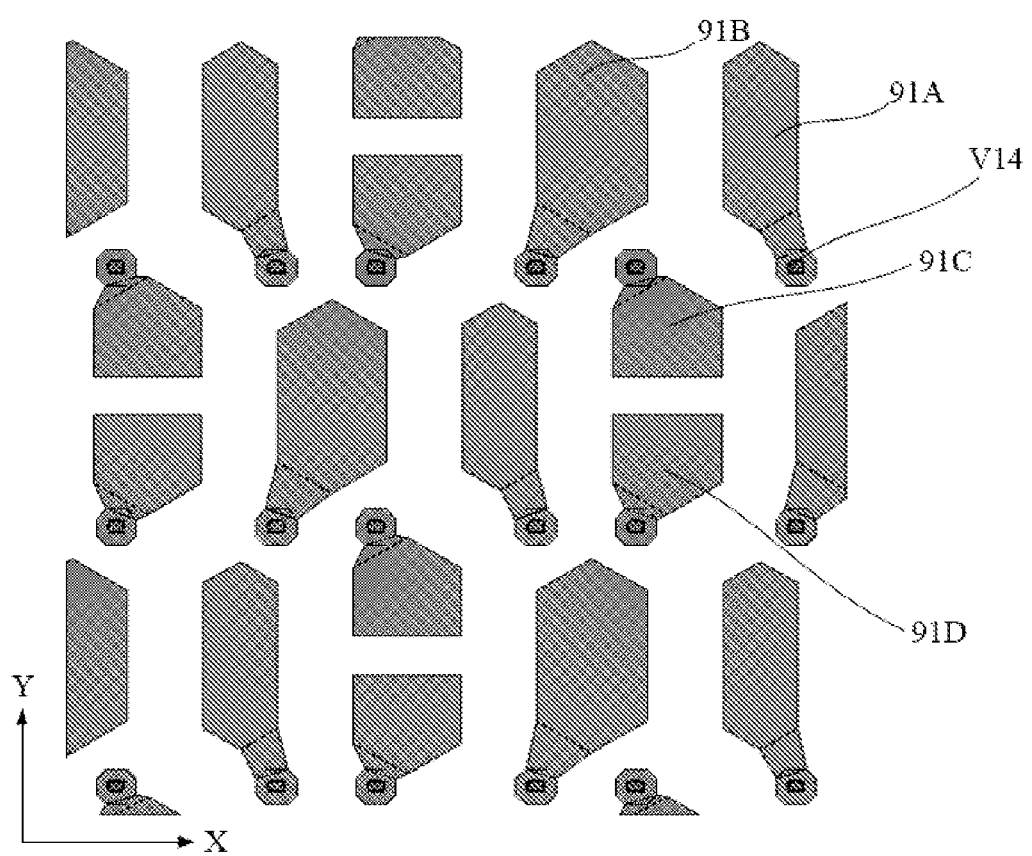
FIG. 20 is a schematic diagram showing a layout of an anode layer of a display substrate according to an embodiment of the present disclosure.

As shown in FIG. 20, an orthographic projection of the fourteenth through-hole V14 on the base substrate is located within a range of an orthographic projection of the seventh connection electrode 75 on the base substrate. The first planarization layer in the fourteenth through-hole V14 is removed to expose a surface of the seventh connection electrode 75. The fourteenth through-hole V14 is configured to couple the anode to be formed subsequently to the seventh connection electrode 75 via the fourteenth through-hole V14.

Thus, the driving circuit layer is formed on the base substrate.

In some examples, after the driving circuit layer is formed, a light-emitting structure layer is formed on the driving circuit layer. A method for manufacturing the light-emitting structure layer may include steps 11 and 12.

At step 11, an anode pattern is formed. In some examples, the formation of the anode pattern may include: depositing a sixth conductive film on the base substrate with above patterns formed thereon; and patterning the sixth conductive film through a patterning process to form an anode pattern on the second planarization layer. The anode has a pixel arrangement of GGRB, as shown in FIG. 20.

As shown in FIG. 20, the anode pattern may include a first anode 91A of the red light-emitting device, a second anode 91B of the blue light-emitting device, a third anode 91C of the first green light-emitting device, and a fourth anode 91D of the second green light-emitting device. The red subpixel R that emits red light may be formed in the region where the first anode 91A is located. The blue subpixel B that emits blue light may be formed in the region where the second anode 91B is located. The first green subpixel G1 that emits green light may be formed in the region where the third anode 91C is located. The second green subpixel G2 that emits green light may be formed in the region where the fourth anode 91D is located. The red subpixel R and the blue subpixel B are sequentially arranged along the second direction Y. The first green subpixel G1 and the second green subpixel G2 are sequentially arranged along the second direction Y. The first green subpixel G1 and the second green subpixel G2 are disposed on a side of the red subpixel R and the blue subpixel B along the first direction Y, respectively. The red subpixel R, the blue subpixel B, the first green subpixel G1, and the second green subpixel G2 constitute one of the pixel units.

In some examples, in one of the pixel units, the first anode 91A is electrically coupled to the seventh connection electrode 75 in the circuit unit in $M^{th}$ row and $N^{th}$ column via the fourteenth through-hole V14 in the circuit unit in $M^{th}$ row and $N^{th}$ column. The second anode 91B is coupled to the seventh connection electrode 75 in the circuit unit in $(M+1)^{th}$ row and $N^{th}$ column via the fourteenth through-hole V14 in the circuit unit in $(M+1)^{th}$ row and $N^{th}$ column. The third anode 91C is coupled to the seventh connection electrode 75 in the circuit unit in $M^{th}$ row and $(N+1)^{th}$ column via the fourteenth through-hole V14 in the circuit unit in $M^{th}$ row and $(N+1)^{th}$ column. The fourth anode 91D is coupled to the seventh connection electrode 75 in the circuit unit in $(M+1)^{th}$ row and $(N+1)^{th}$ column via the fourteenth through-hole V14 in the circuit unit in $(M+1)^{th}$ row and $(N+1)^{th}$ column. In another pixel unit, the first anode 91A is coupled to the seventh connection electrode 75 in the circuit unit in $(M+1)^{th}$ row and $(N+2)^{th}$ column via the fourteenth through-hole V14 in the circuit unit in $(M+1)^{th}$ row and $(N+2)^{th}$ column. The second anode 91B is coupled to the seventh connection electrode 75 in the circuit unit in $M^{th}$ row and $(N+2)^{th}$ column via the fourteenth through-hole V14 in the circuit unit in $M^{th}$ row and $(N+2)^{th}$ column. The third anode 91C is coupled to the seventh connection electrode 75 in the circuit unit in $(M+1)^{th}$ row and $(N+3)^{th}$ column via the fourteenth through-hole V14 in the circuit unit in $(M+1)^{th}$ row and $(N+3)^{th}$ column. The fourth anode 91D is coupled to the seventh connection electrode 75 in the circuit unit in $M^{th}$ row and $(N+3)^{th}$ column via the fourteenth through-hole V14 in the circuit unit in $M^{th}$ row and $(N+3)^{th}$ column.

In some examples, since the seventh connection electrode 75 in the at least one circuit unit is coupled to the sixth connection electrode 67 via the thirteenth through-hole V14 and the sixth connection electrode 67 is coupled to the second region of the active layer 14 of the sixth transistor via the sixth through-hole V6, the four anodes of at least one pixel unit are coupled to the pixel driving circuits of the four circuit units of one circuit unit group respectively, so that the pixel driving circuits can drive the light-emitting devices to emit light.

In some examples, the first anodes 91A in various pixel units may have the same or different shape and position. The second anodes 91B in various pixel units may have the same or different shape and position. The third anodes 91C in various pixel units may have the same or different shape and position. The fourth anodes 91D in various pixel units may have the same or different shape and position. In some examples, the two first anodes 91A, which are respectively coupled to the pixel driving circuit of the circuit unit in $M^{th}$ row and $N^{th}$ column and to the pixel driving circuit in the circuit unit in $(M+1)^{th}$ row and $(N+2)^{th}$ column, come in the same shape and position. The two second anodes 91B, which are respectively coupled to the pixel driving circuit of the circuit unit in the $(M+1)^{th}$ row and $N^{th}$ column and to the pixel driving circuit of the circuit unit in the $(M)^{th}$ row and $(N+2)^{th}$ column, come in the same shape and position. The two third anodes 91C, which are respectively coupled to the pixel driving circuit of the circuit unit in the $M^{th}$ row and $(N+1)^{th}$ column and to the pixel driving circuit of the circuit unit in the $(M+1)^{th}$ row and $(N+3)^{th}$ column, come in the same shape and position. The two fourth anodes 91D, which are respectively coupled to the pixel driving circuit of the circuit unit in $(M+1)^{th}$ row and $(N+1)^{th}$ column and to the pixel driving circuit of the circuit unit in $M^{th}$ row and $(N+3)^{th}$ column, come in the same shape and position.

In some examples, the anodes of the four subpixels in one pixel unit may have the same or different shape and area. In some examples, the first anode 91A, the second anode 91B, the third anode 91C, and the fourth anode 91D in one pixel unit may have different shapes and areas from each other.

At step 12, a pixel definition layer pattern is formed. In an exemplary embodiment, the formation of the pixel definition layer pattern may include: coating a pixel definition film on the base substrate with above patterns formed thereon; and patterning the pixel definition film through a patterning process to form the pixel definition layer pattern.

The pixel definition layer pattern 101 may include a first pixel opening 100A exposing the first anode 91A, a second pixel opening 100B exposing the second anode 91B, a third pixel opening 100C exposing the third anode 91C, and a fourth pixel opening 100D exposing the fourth anode 91D.

In some examples, the subsequent preparation steps may include: forming an organic light-emitting layer through an evaporation or ink-jet printing process, such that the organic light-emitting layer is coupled to the anodes through the pixel openings; forming a cathode on the organic light-emitting layer, such that the cathode is coupled to the organic light-emitting layer; forming an encapsulation layer including a first encapsulation layer, a second encapsulation layer, and a third encapsulation layer stacked on each other, wherein the first encapsulation layer and the third encapsulation layer may be made of an inorganic material, and the second encapsulation layer may be made of an organic material. The second encapsulation layer is between the first encapsulation layer and the third encapsulation layer, thereby preventing the external water vapor from entering the light-emitting structure layer.

In some examples, the base substrate may be a flexible substrate or a rigid substrate. The rigid substrate may include, but not limited to, one or more of glass, quartz, and the flexible substrate may include, but not limited to, one or more of polyethylene terephthalate, ethylene terephthalate, polyetheretherketone, polystyrene, polycarbonate, polyarylate, polyimide, polyvinyl chloride, polyethylene, and textile fibers. In an exemplary embodiment, the flexible substrate may include a first flexible material layer, a first inorganic material layer, a semiconductor layer, a second flexible material layer, and a second inorganic material layer stacked on each other. The first flexible material layer and the second flexible material layer may be made of Polyimide (PI), polyethylene terephthalate (PET), or a surface-treated polymer film. The first inorganic material layer and the second inorganic material layer may be made of silicon nitride (SiNx), silicon oxide (SiOx), or the like, for improving the water and oxygen resistance of the base substrate. The semiconductor layer may be made of amorphous silicon (a-si).

In an exemplary embodiment, the first, second, third, fourth, and fifth conductive layers and the shield electrode layer may be made of a metal material, such as any one or more of silver (Ag), copper (Cu), aluminum (Al), and molybdenum (Mo), or an alloy material of the above metals, such as aluminum neodymium alloy (AlNd) or molybdenum niobium alloy (MoNb), and may have a single-layer structure or a multi-layer composite structure, such as Mo/Cu/Mo, and the like. The first insulation layer, the second insulation layer, the third insulation layer, the fourth insulation layer, the fifth insulation layer, the sixth insulation layer, the seventh insulation layer, and the first planarization layer may be made of any one or more of silicon oxide (SiOx), silicon nitride (SiNx), and silicon oxynitride (SiON), and may have a single-layer structure, a multilayer structure, or a composite layer structure. The first semiconductor layer may be made of a silicon-containing material such as amorphous silicon (a-Si) or polysilicon (p-Si). The second semiconductor layer may be made of an oxide material such as amorphous indium gallium zinc oxide (a-IGZO), zinc oxynitride (ZnON), indium zinc tin oxide (IZTO), or the like. The first planarization layer may be made of an organic material such as resin or the like. The sixth conductive layer may have a single-layer structure such as indium tin oxide (ITO) or indium zinc oxide (IZO), or may have a multi-layer composite structure such as ITO/Ag/ITO, or the like. The pixel definition layer may be made of polyimide, acryl, or polyethylene terephthalate. The cathode may be made of any one or more of magnesium (Mg), silver (Ag), aluminum (Al), copper (Cu), and lithium (Li), or an alloy containing any one or more of the above metals.

As can be seen from the structure of the display substrate and the manufacturing method thereof described above, in the display substrate provided by the present disclosure, the shield electrode layer covers the active layer of the third transistor T3 as the driving transistor, thereby effectively stabilizing the potential of the third transistor T3, reducing the influence on the aperture ratio, effectively improving the uniformity and quality of the display.

In a second aspect, an embodiment of the present disclosure provides a display device, which includes the foregoing display substrate. The display device may be any product or component having a display function, such as a mobile phone, a tablet computer, a television, a display, a notebook computer, a digital photo frame, a navigator, etc., but the embodiment of the present invention is not limited thereto. It is to be understood that the above embodiments are merely exemplary embodiments that are employed to illustrate the principles of the disclosed embodiments, but the embodiment of the present invention is not limited thereto. It will be apparent to those skilled in the art that various modifications and improvements can be made to the disclosed embodiments of the present invention without departing from the spirit and scope of the invention, and such modifications and improvements are also considered to be within the scope of the disclosed embodiments of the present invention.

What is claimed is:

1. A display substrate, comprising: a base substrate, a driving circuit layer on the base substrate, a light-emitting structure layer on a side of the driving circuit layer away from the base substrate, and a shield electrode layer on a side of the driving circuit layer proximal to the base substrate; wherein the light-emitting structure layer comprises a plurality of light-emitting devices, the driving circuit layer comprises a plurality of pixel driving circuits, at least part of transistors of each of the plurality of pixel driving circuits are oxide thin film transistors, and at least part of transistors of each of the plurality of pixel driving circuits are low-temperature polycrystalline silicon thin film transistors, wherein an orthographic projection of the shield electrode layer on the base substrate at least partially overlaps orthographic projections of third transistors in at least part of the plurality of pixel driving circuits on the base substrate;

the shield electrode layer is coupled to a constant voltage terminal via a first power line; and the shield electrode layer comprises a plurality of shield electrodes, the shield electrodes arranged along a first direction are electrically coupled to each other and the shield electrodes arranged along a second direction are electrically coupled to each other with the first direction intersecting the second direction, such that the plurality of shield electrodes are coupled together to form a mesh structure, the driving circuit layer comprises the shield electrode layer, a first semiconductor layer, a first conductive layer, a second conductive layer, a second semiconductor layer, a third conductive layer, a fourth conductive layer, and a fifth conductive layer sequentially stacked in a direction away from the base substrate, the first semiconductor layer comprises an active layer of a third transistor, an active layer of a fourth transistor, an active layer of a fifth transistor, an active layer of a sixth transistor, and an active layer of a seventh transistor in the pixel driving circuit, the first conductive layer comprises a first scan line, a light-emitting control line, a first electrode of a storage capacitor in the pixel driving circuit, and a first shield layer connection electrode, the second conductive layer comprises a first gate electrode of a first transistor, a first gate electrode of a second transistor, a second electrode of the storage capacitor of the pixel driving circuit, a first portion of a second scan line and a first portion of a reset signal line, the second semiconductor layer comprises an active layer of a first transistor and an active layer of a second transistor of the pixel driving circuit, the third conductive layer comprises a second gate electrode of the first transistor and a second gate electrode of the second transistor of the pixel driving circuit, a second portion of the second scan line and a second portion of the reset signal line, the fourth conductive layer comprise a second connection electrode, and the fifth conductive layer comprises a first initial signal line, a second initial signal line, the first power line, and a data line, wherein the shield electrode in the shield electrode layer is connected to the first shield layer connection electrode, which is in the same layer as the first scan line, the light-emitting control line and the first electrode of the storage capacitor; the second connection electrode in the fourth conductive layer is connected to the first shield layer connection electrode, which is in the same layer as the first scan line, the light-emitting control line and the first electrode of the storage capacitor; and the second connection electrode in the fourth conductive layer is connected to the first power line, which is in the same layer as the first initial signal line, the second initial signal line and the data line.

2. The display substrate of claim 1, wherein an orthographic projection of each of the shield electrodes on the base substrate overlaps an orthographic projection of an active layer of the third transistor of a corresponding pixel driving circuit on the base substrate.

3. The display substrate of claim 1, wherein the active layer of the third transistor comprises a channel region, and first and second regions on both sides of the channel region, and an orthographic projection of each of the shield electrodes on the base substrate overlaps an orthographic projection of the channel region of the third transistor of a corresponding pixel driving circuit on the base substrate and does not overlap orthographic projections of the first and second regions of the third transistor of the corresponding pixel driving circuit on the base substrate.

4. The display substrate of claim 1, wherein each of the plurality of shield electrodes is coupled to a corresponding first shield layer connection electrode via a through-hole, the corresponding first shield layer connection electrode is coupled to a corresponding second connection electrode via a through-hole, and the corresponding second connection electrode is coupled to the first power line via a through-hole.

5. The display substrate of claim 4, wherein for each of the plurality of circuit units, an orthographic projection of the through-hole coupling the shield electrode to the corresponding first shield layer connection electrode on the base substrate does not overlap an orthographic projection of the through-hole coupling the corresponding first shield layer connection electrode to the corresponding second connection electrode on the base substrate.

6. The display substrate of claim 1, wherein a first notch portion is between two adjacent shield electrodes in the first direction, and/or a second notch portion is between two adjacent shield electrodes in the second direction.

7. The display substrate of claim 6, wherein an orthographic projection of the first notch portion on the base substrate does not overlap an orthographic projection of an active layer of a fourth transistor of a corresponding pixel driving circuit on the base substrate, and/or an orthographic projection of the second notch portion on the base substrate does not overlap an orthographic projection of an active layer of a fifth transistor of the corresponding pixel driving circuit on the base substrate.

8. The display substrate of claim 1, wherein an orthographic projection of each of the plurality of shield electrodes on the base substrate overlaps an orthographic projection of a first electrode of a storage capacitor of a corresponding pixel driving circuit on the base substrate.

9. The display substrate of claim 8, wherein an edge of the orthographic projection of the shield electrode on the base substrate is conformal to an edge of the orthographic projection of the first electrode on the base substrate.

10. The display substrate of claim 1, wherein an orthographic projection of each of the plurality of first shield layer connection electrodes on the base substrate is between an orthographic projection of the light-emitting control line on the base substrate and an orthographic projection of the first scan line on the base substrate, and each of the plurality of shield electrodes is coupled to a corresponding first shield layer connection electrode via a through-hole, the corresponding first shield layer connection electrode is coupled to a corresponding second connection electrode via a through-hole, and the corresponding second connection electrode is coupled to the first power line via a through-hole.

11. A display device, comprising the display substrate of claim 1.

12. A display substrate, comprising: a base substrate, a driving circuit layer on the base substrate, a light-emitting structure layer on a side of the driving circuit layer away from the base substrate, and a shield electrode layer on a side of the driving circuit layer proximal to the base substrate; wherein the light-emitting structure layer comprises a plurality of light-emitting devices, the driving circuit layer comprises a plurality of pixel driving circuits, at least part of transistors of each of the plurality of pixel driving circuits are oxide thin film transistors, and at least part of transistors of each of the plurality of pixel driving circuits are low-temperature polycrystalline silicon thin film transistors, wherein an orthographic projection of the shield electrode layer on the base substrate at least partially overlaps orthographic projections of third transistors in at least part of the plurality of pixel driving circuits on the base substrate;

the shield electrode layer is coupled to a constant voltage terminal via a second power line or via a first reference voltage line; and the shield electrode layer comprises a plurality of shield electrodes, the shield electrodes arranged along a first direction are electrically coupled to each other and the shield electrodes arranged along a second direction are electrically coupled to each other with the first direction intersecting the second direction, such that the plurality of shield electrodes are coupled together to form a mesh structure, the driving circuit layer comprises the shield electrode layer, a first semiconductor layer, a first conductive layer, a second conductive layer, a second semiconductor layer, a third conductive layer, a fourth conductive layer, and a fifth conductive layer sequentially stacked in a direction away from the base substrate, the shield electrode layer comprises the plurality of shield electrodes in a display region, a plurality of second connection electrodes in a frame region and respectively connected to the plurality of shield electrodes, and a connection electrode bar in the frame region and connected to the plurality of second connection electrodes, the first semiconductor layer comprises an active layer of a third transistor, an active layer of a fourth transistor, an active layer of a fifth transistor, an active layer of a sixth transistor, and an active layer of a seventh transistor in the pixel driving circuit, the first conductive layer comprises a first scan line, a light-emitting control line, and a first electrode of a storage capacitor in the pixel driving circuit, the second conductive layer comprises a first gate electrode of a first transistor, a first gate electrode of a second transistor, a second electrode of the storage capacitor of the pixel driving circuit, a first portion of a second scan line and a first portion of a reset signal line, the second semiconductor layer comprises an active layer of a first transistor and an active layer of a second transistor of the pixel driving circuit, the third conductive layer comprises a second gate electrode of the first transistor and a second gate electrode of the second transistor of the pixel driving circuit, a second portion of the second scan line and a second portion of the reset signal line, the fourth conductive layer comprise the second power line or the first reference voltage line in the frame region, and a plurality of transfer electrodes in the frame region and connected to the second power line or the first reference voltage line, the fifth conductive layer comprises a first initial signal line, a second initial signal line, a first power line, and a data line, the connection electrode bar in the frame region of the shield electrode layer is connected to the plurality of transfer electrodes in the frame region of the fourth conductive layer, so that the plurality of shield electrodes in the shield electrode layer are powered by the second power line or the first reference voltage line in the frame region of the fourth conductive layer.

13. The display substrate of claim 12, wherein the second shield layer connection electrodes arranged along the first direction are electrically coupled to each other, and the shield electrode in the row closest to the frame region is electrically coupled to a corresponding second shield layer connection electrode via a first connection line.

\* \* \* \* \*